(12) United States Patent
Kanamori

(10) Patent No.: US 11,069,709 B2
(45) Date of Patent: Jul. 20, 2021

(54) VERTICAL MEMORY DEVICES

(71) Applicant: Samsung Electronics Co., Ltd., Suwon-si (KR)

(72) Inventor: Kohji Kanamori, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/822,596

(22) Filed: Mar. 18, 2020

(65) Prior Publication Data

US 2020/0219893 A1    Jul. 9, 2020

Related U.S. Application Data

(63) Continuation of application No. 16/126,562, filed on Sep. 10, 2018, now Pat. No. 10,600,804.

(30) Foreign Application Priority Data

Nov. 30, 2017  (KR) .................. 10-2017-0163653

(51) Int. Cl.
*H01L 29/76*    (2006.01)
*H01L 27/11582*    (2017.01)
(Continued)

(52) U.S. Cl.
CPC ........ *H01L 27/11582* (2013.01); *G11C 5/025* (2013.01); *G11C 5/06* (2013.01); *H01L 27/1157* (2013.01); *H01L 27/11556* (2013.01); *H01L 29/36* (2013.01); *H01L 29/42344* (2013.01); *H01L 27/11565* (2013.01)

(58) Field of Classification Search
CPC ......... H01L 27/11582; H01L 27/11556; H01L 27/1157; H01L 27/11565; H01L 29/42344
See application file for complete search history.

(56) References Cited

U.S. PATENT DOCUMENTS 8,592,873 B2    11/2013  Kim et al.
8,877,624 B2    11/2014  Hull et al.
(Continued)

FOREIGN PATENT DOCUMENTS

JP          5908389 B2      4/2016
KR    2013-0137509 A    12/2013
(Continued)

*Primary Examiner* — Phuc T Dang
(74) *Attorney, Agent, or Firm* — Harness, Dickey & Pierce, P.L.C.

(57) ABSTRACT

A vertical memory device includes a gate electrode structure on a substrate, and a channel. The gate electrode structure includes gate electrodes spaced apart from each other in a vertical direction substantially perpendicular to an upper surface of the substrate. The channel extends through the gate electrode structure in the vertical direction on the substrate. The channel includes a first portion having a slanted sidewall with respect to the upper surface of the substrate and a second portion contacting an upper surface of the first portion and having a slanted sidewall with respect to the upper surface of the substrate. A width of an upper surface of the second portion is less than a width of the upper surface of the first portion. An impurity region doped with carbon or p-type impurities is formed at an upper portion of the substrate. The channel contacts the impurity region.

20 Claims, 29 Drawing Sheets

(51) Int. Cl.
*H01L 29/36* (2006.01)
*H01L 29/423* (2006.01)
*H01L 27/1157* (2017.01)
*G11C 5/02* (2006.01)
*G11C 5/06* (2006.01)
*H01L 27/11556* (2017.01)
*H01L 27/11565* (2017.01)

(56) References Cited

U.S. PATENT DOCUMENTS

| | | |
|---|---|---|
| 9,093,369 B2 | 7/2015 | Shin et al. |
| 9,397,109 B1 | 7/2016 | Fukuzumi |
| 9,520,406 B2 | 12/2016 | Makala et al. |
| 9,691,781 B1 | 6/2017 | Nishikawa et al. |
| 2012/0003800 A1* | 1/2012 | Lee .................. H01L 27/11578 438/261 |
| 2016/0005760 A1 | 1/2016 | Lee et al. |
| 2016/0190150 A1* | 6/2016 | Chu .................. H01L 29/7827 257/324 |
| 2017/0330895 A1 | 11/2017 | Fukuzumi et al. |
| 2017/0345843 A1 | 11/2017 | Lee et al. |
| 2018/0053774 A1 | 2/2018 | Sakamoto |
| 2018/0175050 A1* | 6/2018 | Son .................. H01L 27/11582 |
| 2019/0067314 A1* | 2/2019 | Lu .................... H01L 27/11556 |

FOREIGN PATENT DOCUMENTS

| | | |
|---|---|---|
| KR | 2016-0003977 A | 1/2016 |
| KR | 10-1677740 B1 | 11/2016 |

\* cited by examiner

FIG. 21
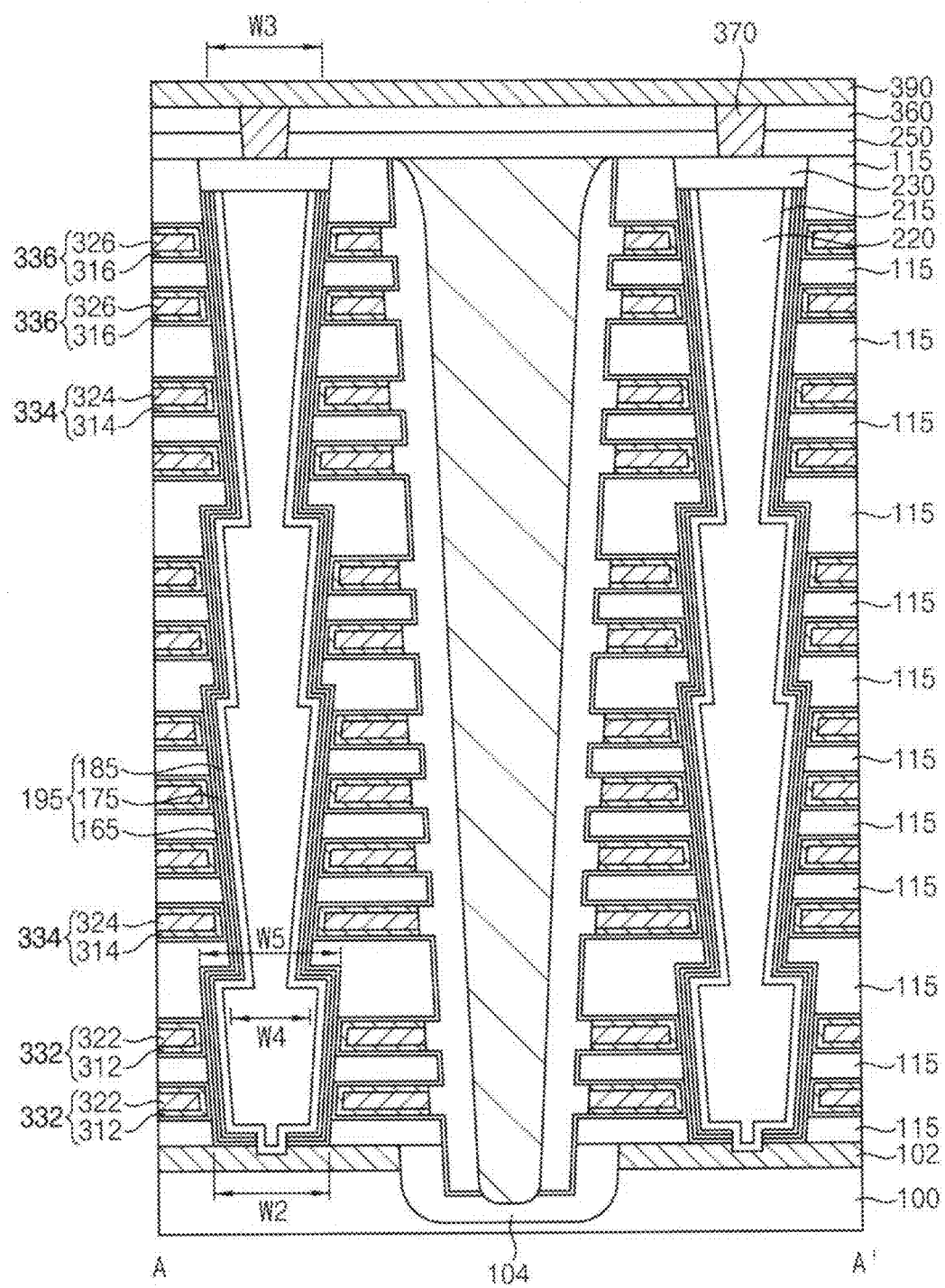
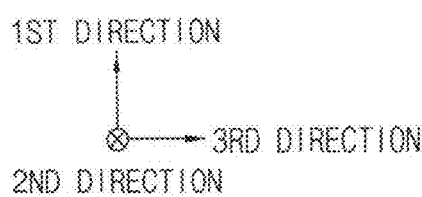

VERTICAL MEMORY DEVICES

CROSS-REFERENCE TO RELATED APPLICATIONS

This application is a continuation of U.S. application Ser. No. 16/126,562, filed on Sep. 10, 2018, U.S. Pat. No. 10,600,804, which claims priority under 35 USC § 119 to Korean Patent Application No. 10-2017-0163653, filed on Nov. 30, 2017 in the Korean Intellectual Property Office (KIPO), the contents of each of which are herein incorporated by reference in their entirety.

BACKGROUND

1. Field

Inventive concepts relate to vertical memory devices.

2. Description of Related Art

As the stack number of a mold structure in a VNAND flash memory device increases, depths of channel holes extending through the mold structure may have distributions. Thus, in an etching process for forming the channel holes, the mold structure may be over-etched so that all of the channel holes may expose an upper surface of the substrate, which may form a recess on the substrate. As an ONO layer may be formed on the recess, a parasitic capacitance may be generated so that the electrical characteristics of the VNAND flash memory device may deteriorate.

SUMMARY

Example embodiments provide a vertical memory device having good characteristics.

According to an aspect of inventive concepts, a vertical memory device may include a substrate, a gate electrode structure, and a channel. The gate electrode structure may be on the substrate. An upper portion of the substrate may include an impurity region doped with carbon or p-type impurities. The gate electrode structure may include gate electrodes spaced apart from each other in a vertical direction substantially perpendicular to an upper surface of the substrate. The channel may extend through the gate electrode structure in the vertical direction on the substrate. The channel may include a first portion and a second portion. The first portion may have a slanted sidewall with respect to the upper surface of the substrate. The second portion may contact an upper surface of the first portion and may have a slanted sidewall with respect to the upper surface of the substrate. A width of an upper surface of the second portion may be less than a width of the upper surface of the first portion. The channel may contact the impurity region.

According to an aspect of inventive concepts, a vertical memory device may include a substrate, a channel structure, a charge storage structure, and a gate electrode structure. The substrate may include an impurity region doped with carbon or p-type impurities. The channel structure may include a lower channel on an upper surface of the impurity region of the substrate and an upper channel contacting an upper surface of the lower channel. The lower channel may have a slanted sidewall with respect to an upper surface of the substrate and a pillar shape. The upper channel may have a slanted sidewall with respect to the upper surface of the substrate and may have a hollow cylindrical shape. The charge storage structure may cover an outer sidewall of the upper channel. The gate electrode structure may include gate electrodes spaced apart from each other in a vertical direction substantially perpendicular to the upper surface of the substrate. Each of the gate electrodes may cover an outer sidewall of the channel structure or the charge storage structure. A width of an upper surface of the charge storage structure may be less than a maximum width of the lower channel.

According to an aspect of inventive concepts, a vertical memory device may include a gate electrode structure on a substrate including an impurity region at an upper portion of the substrate, and a channel on the substrate. The gate electrode structure may include gate electrodes spaced apart from each other in a vertical direction substantially perpendicular to an upper surface of the substrate. The channel may extend in the vertical direction on the substrate through the gate electrode structure and an upper portion of the impurity region of the substrate. The channel may include a plurality of portions sequentially stacked in the vertical direction and connected with each other. Each of the plurality of portions may have a slanted sidewall with respect to the upper surface of the substrate. A width of an upper surface of a first portion among the plurality of portions of the channel disposed at an odd-numbered level from the upper surface of the substrate may be greater than a width of an upper surface of a second portion among the plurality of portions of the channel directly above the first portion.

In vertical memory devices according to example embodiments, the deterioration of the characteristics of the transistors due to the bending or misalignment of the channels extending in the vertical direction may be reduced or prevented.

BRIEF DESCRIPTION OF THE DRAWINGS

FIG. 21 is a cross-sectional view illustrating a vertical memory device according to some example embodiments;

DETAILED DESCRIPTION

The above and other aspects and features of vertical memory devices and the methods of manufacturing the same according to some example embodiments will become readily understood from detail descriptions that follow, with reference to the accompanying drawings.

Figure 1:
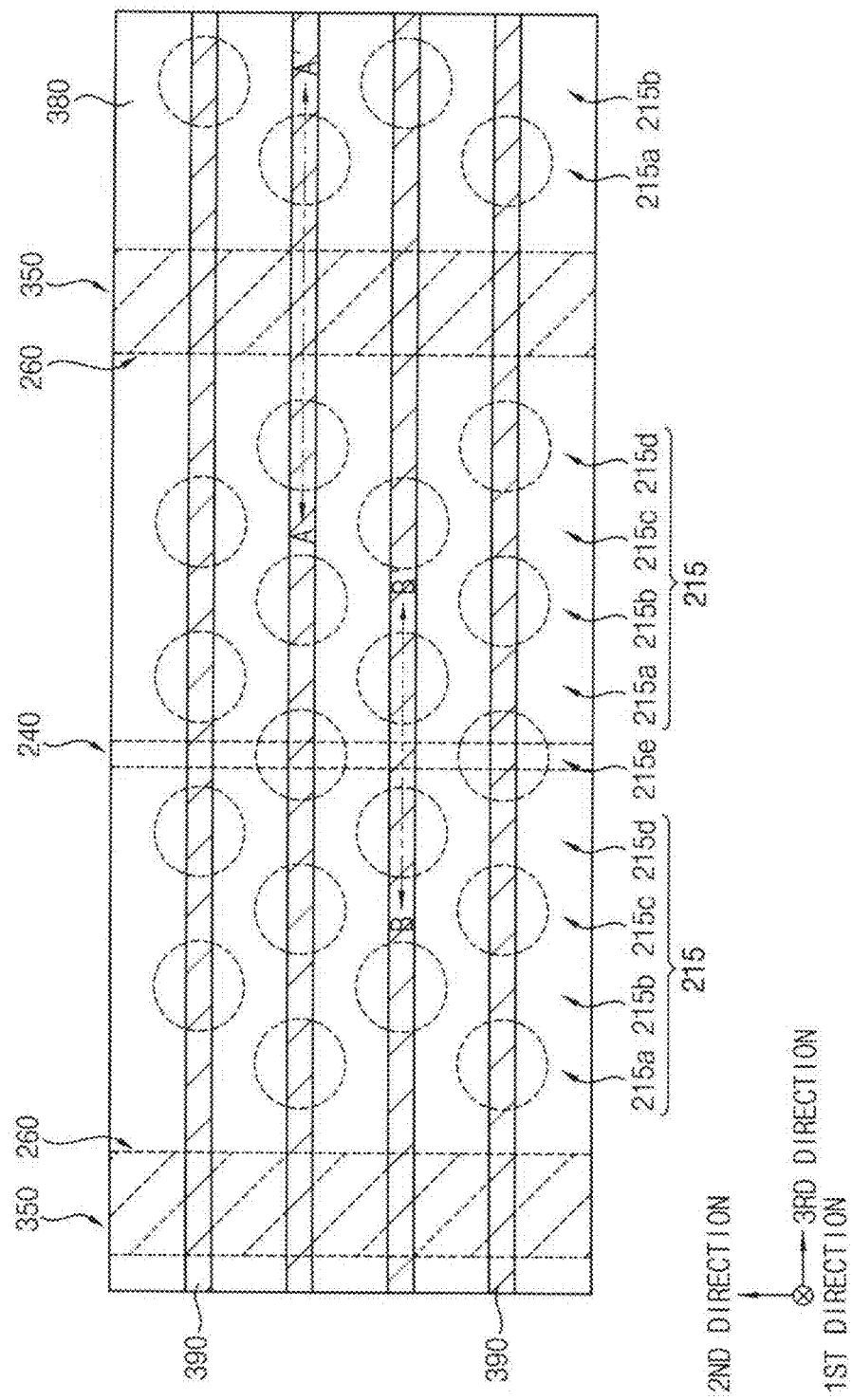
FIGS. 1 to 3 are a plan view and cross-sectional views illustrating a vertical memory device according to some example embodiments.
Figure 2:
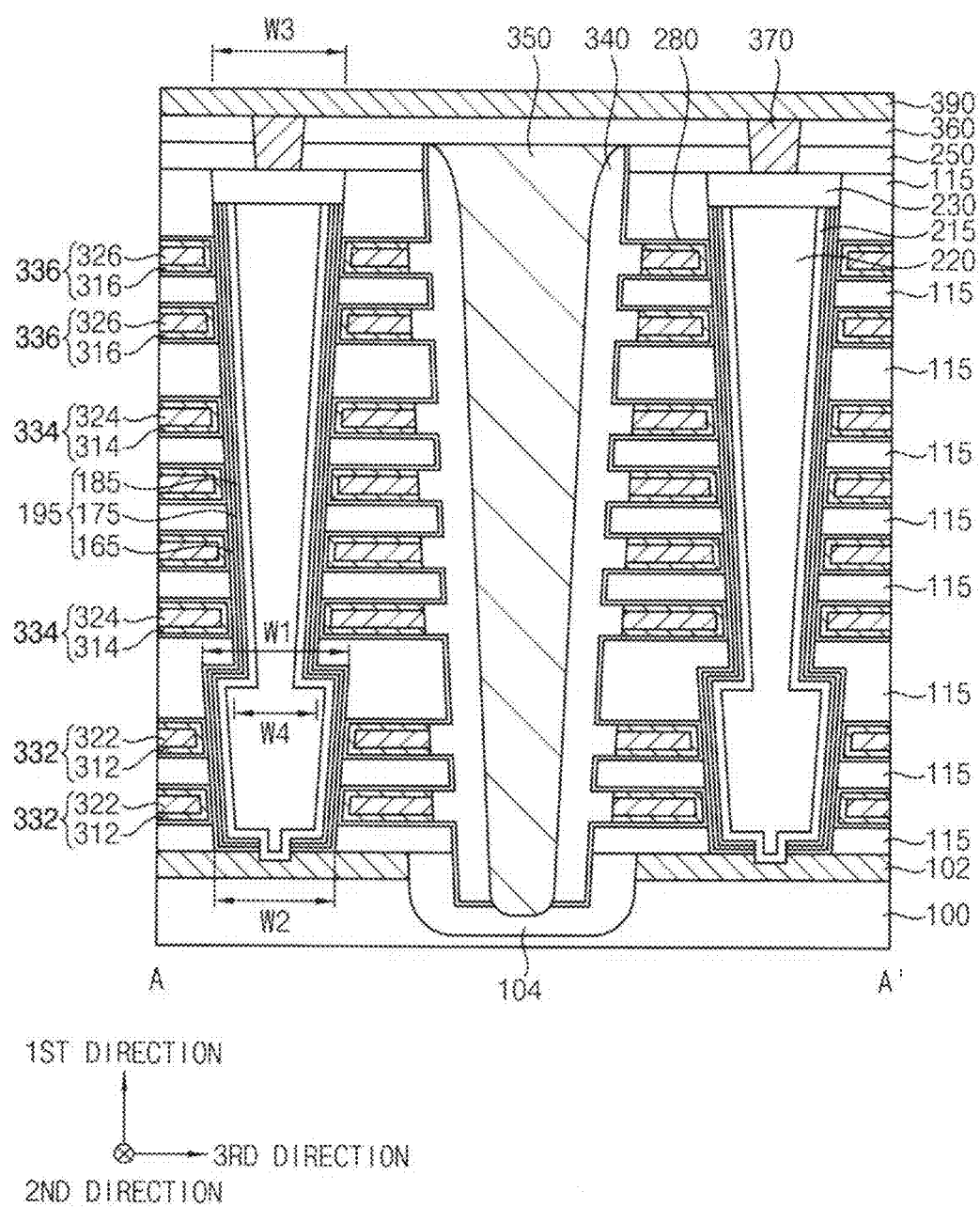
Figure 3:
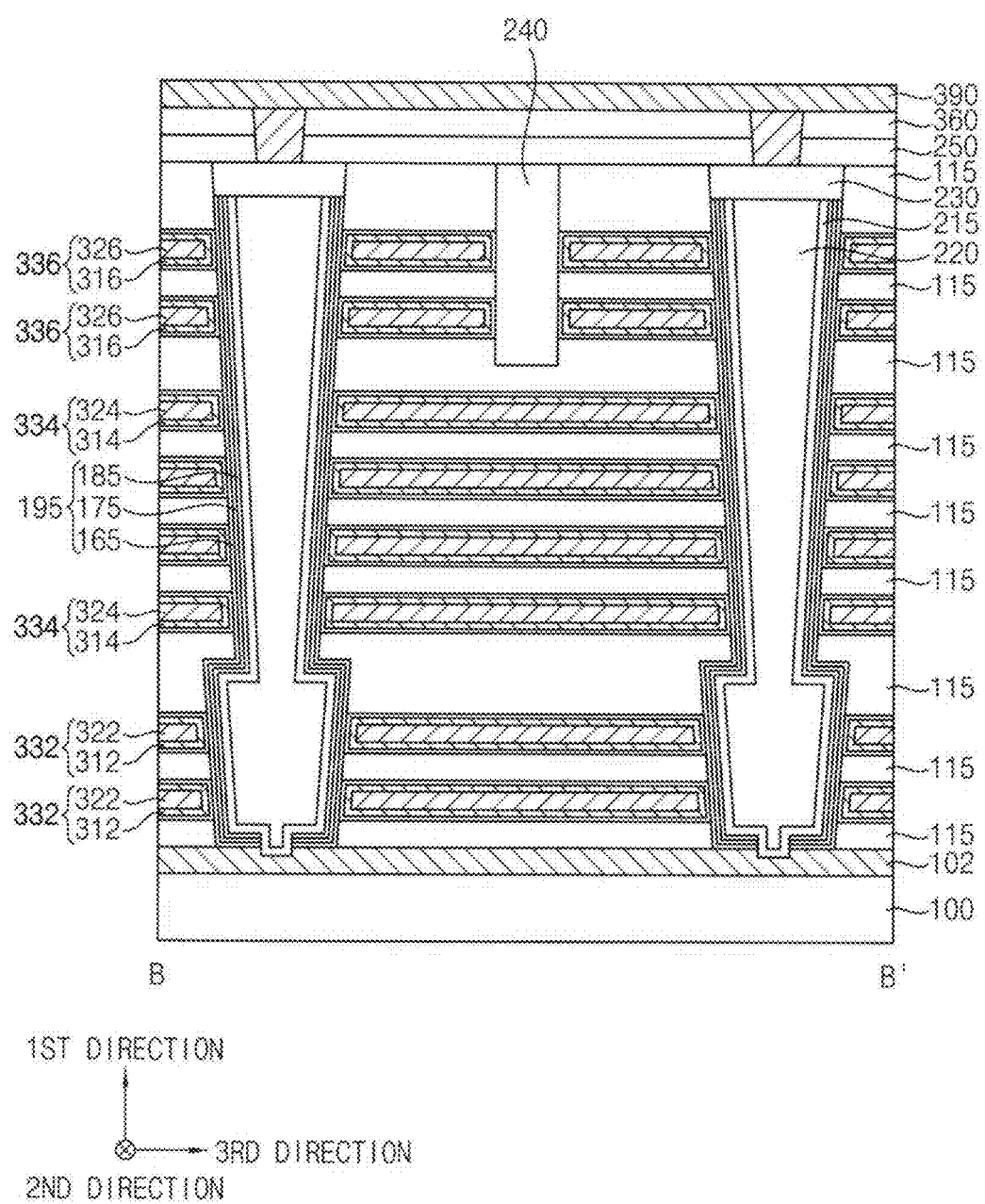

FIGS. 1 to 3 are a plan view and cross-sectional views illustrating a vertical memory device according to some example embodiments. Particularly, FIG. 1 is a plan view, FIG. 2 is a cross-sectional view taken along a line A-A' of FIG. 1, and FIG. 3 is a cross-sectional view taken along a line B-B' of FIG. 1.

Hereinafter, a direction substantially perpendicular to an upper surface of a substrate may be defined as a first direction, and two directions substantially parallel to the upper surface of the substrate and crossing each other may be defined as second and third directions, respectively. In some example embodiments, the second and third directions may be substantially perpendicular to each other.

Referring to FIGS. 1 to 3, a vertical memory device may include a gate electrode structure, an insulation pattern structure, and a second structure extending through the gate electrode structure and the insulation pattern structure. The vertical memory device may further include first and second impurity regions 102 and 104, a division layer 240, a second blocking layer 280, a second spacer 340, a common source line (CSL) 350, a contact plug 370, a bit line 390, and first to third insulating interlayers 250, 360 and 380. In some embodiments, the third insulating layer 380 may be omitted.

The substrate 100 may include a semiconductor such as silicon, germanium, silicon-germanium or a III-V compound such as GaP, GaAs, GaSb, etc. In some embodiments, the substrate 100 may be a semiconductor-on-insulator substrate such as a silicon-on-insulator (SOI) substrate or a germanium-on-insulator (GOI) substrate.

The first impurity region 102 may be formed at an upper portion of the substrate 100. The first impurity region 102 may include carbon, or p-type impurities, e.g., boron.

The gate electrode structure may include a plurality of gate electrodes at a plurality of levels, respectively, spaced apart from each other in the first direction on the substrate 100. The gate electrode structure may extend in the second direction, and a plurality of gate electrode structures may be formed in the third direction. That is, neighboring ones of the gate structures in the third direction at each level, each of which may extend in the second direction, may be spaced apart from each other by a second opening 260 extending in the second direction.

In some example embodiments, the CSL 350 may be formed in the second opening 260 to extend in the second direction, and the second spacer 340 may be formed on each of opposite sidewalls of the CSL 350 in the third direction. The second impurity region 104 may be formed at an upper portion of the substrate 100 adjacent a lower surface of the CSL 350.

The CSL 350 may include a metal, a metal nitride, and/or a metal silicide. The second spacer 340 may include an insulating material such as an oxide (e.g., silicon oxide), and the second impurity region 104 may include n-type impurities, e.g., phosphorous, arsenic, etc.

Each of the gate electrode structures may include at least one first gate electrode 332, a plurality of second gate electrodes 334 at a plurality of levels, respectively, and at least one third gate electrode 336, which may be sequentially stacked in the first direction.

In some example embodiments, the first gate electrode 332 may serve as a ground selection line (GSL), each of the second gate electrodes 334 may serve as a word line, and the third gate electrode 336 may serve as a string selection line (SSL).

FIG. 2 shows two first gate electrodes 332 at two levels, respectively, four second gate electrodes 334 at four levels, respectively, and two third gate electrodes 336 at two levels, respectively; however, inventive concepts are not limited thereto. For example, each of the first and third gate electrodes 332 and 336 may be formed at one level or a plurality of levels, respectively, and more than four second gate electrodes 334 may be formed at more than four levels, respectively. Some of the second gate electrodes 334 adjacent the first gate electrodes 332 and/or the third gate electrode 336 may serve as a dummy word line.

The first gate electrode 332 may include a first gate conductive pattern 322 extending in the second direction and a first gate barrier pattern 312 covering upper and lower surfaces and a sidewall of the first gate conductive pattern 322. The second gate electrode 334 may include a second gate conductive pattern 324 extending in the second direction and a second gate barrier pattern 314 covering upper and lower surfaces and a sidewall of the second gate conductive pattern 324. The third gate electrode 336 may include a third gate conductive pattern 326 extending in the second direction and a third gate barrier pattern 316 covering upper and lower surfaces and a sidewall of the third gate conductive pattern 326.

The first to third gate conductive patterns 322, 324 and 326 may include a metal having a low resistance, e.g., tungsten, titanium, tantalum, platinum, etc., and the first to third gate barrier patterns 312, 314 and 316 may include a metal nitride, e.g., titanium nitride, tantalum nitride, etc.

The insulation pattern structure may include a plurality of insulation patterns 115 sequentially stacked on the substrate 100 in the first direction. The insulation patterns 115 may be formed between an upper surface of the first impurity region 102 and the first gate electrode 332, between the first to third gate electrodes 332, 334 and 336 adjacent to each other in the first direction, and on the third gate electrode 336.

In some example embodiments, each of the insulation patterns 115 at a plurality of levels, respectively, may extend in the second direction, and a plurality of insulation patterns 115 at each level may be spaced apart from each other in the third direction by the second opening 260. The insulation patterns 115 may include an insulating material such as an oxide (e.g., silicon oxide).

Some of the plurality of insulation patterns 115 may be thicker than others of the plurality of insulation patterns 115. An insulation pattern 115 between a lowermost one of the second gate electrodes 334 and an uppermost one of the first gate electrodes 332 and/or an insulation pattern between a lowermost one of the third gate electrodes 336 and an uppermost one of the second gate electrodes 334 may be thicker than other insulation patterns 115. For example, one of the insulation patterns 115 at a third level from the upper surface of the substrate 100, an uppermost one of the insulation patterns 115, and one of the insulation patterns 115 at a third level from above may be thicker than other ones of the insulation patterns 115 at other levels, respectively; however, inventive concepts are not limited thereto.

The second structure may include a first structure and a pad 230 sequentially stacked on the first impurity region 102 of the substrate 100, and may extend in the first direction through the gate electrode structure and the insulation pattern structure.

The first structure may include a channel 215 extending in the first direction from an upper surface of the first impurity region 102, a charge storage structure 195 covering an outer sidewall of the channel 215, and a filling pattern 220 filling an inner space formed by the channel 215.

In some example embodiments, the channel 215 may have a hollow cylindrical shape or a cup-like shape, and the filling pattern 220 may fill the space formed by the channel 215. That is, a lower surface and a sidewall of the filling pattern 220 having a pillar shape may be covered by the channel 215.

The channel 215 may include a semiconductor, e.g., crystalline silicon, and the filling pattern 220 may include an insulating material such as an oxide (e.g., silicon oxide).

In some example embodiments, a plurality of channels 215 may be formed in each of the second and third directions, and thus a channel array may be defined. In some example embodiments, the channel array may include a first channel column 215a including channels 215 disposed in the second direction, and a second channel column 215b including channels 215 disposed in the second direction and being spaced apart from the first channel column 215a in the third direction. The channels 215 included in the first channel column 215a may be disposed to have acute angles with the second direction or the third direction from the channels 215 included in the second channel column 215b.

The first and second channel columns 215a and 215b may be alternately and repeatedly disposed in the third direction. FIG. 1 shows five first channel columns 215a and four second channel columns 215b alternately disposed in the third direction to form a channel group, however, inventive concepts are not limited thereto.

Hereinafter, four channel columns disposed in the third direction in one channel group may be referred to as first, second, third and fourth channel columns 215a, 215b, 215c and 215d, respectively. In this order, one channel column at a central position in the third direction in the channel group may be referred to as a fifth channel column 215e, and the other four channel columns disposed in the third direction in the channel group may be referred to as the first, second, third and fourth channel columns 215a, 215b, 215c and 215d, respectively, again in this order. FIG. 1 shows a channel array including one channel group and a portion of another channel group spaced apart from each other in the third direction. Each of the channel groups may include two channel blocks disposed in the third direction, and the fifth channel column 215e may be disposed between the two channel blocks.

In some example embodiments, the charge storage structure 195 covering the outer sidewall of the channel 215 may have a cup-like shape of which a bottom may be opened. The charge storage structure 195 may include a tunnel insulation pattern 185, a charge storage pattern 175 and a first blocking pattern 165 sequentially stacked from the outer sidewall of the channel 215.

The tunnel insulation pattern 185 and the first blocking pattern 165 may include an insulating material such as an oxide (e.g., silicon oxide), and the charge storage pattern 175 may include a different insulating material such as a nitride (e.g., silicon nitride).

The first structure may have a pillar shape extending in the first direction from the upper surface of the first impurity region 102 at the upper portion of the substrate 100, and the second structure including the first structure and the pad 230 may have a pillar shape. The pad 230 may include, e.g., doped crystalline silicon.

In some example embodiments, the second structure may include lower and upper portions that may be integrally formed and contact each other, each of which may have a slanted sidewall with respect to the upper surface of the substrate 100. An upper surface of the lower portion of the second structure may have a first width W1 in a horizontal direction substantially parallel to the upper surface of the substrate 100, and a lower surface of the lower portion of the second structure may have a second width W2 in the horizontal direction that may be less than first width W1. Additionally, an upper surface of the upper portion of the second structure may have a third width W3 in the horizontal direction, and a lower surface of the upper portion of the second structure may have a fourth width W4 in the horizontal direction that may be less than third width W3.

In some example embodiments, the first width W1 may be greater than the third direction W3, and the third width W3 may be greater than the second width W2. In some example embodiments, the fourth width W4 may be less than the second width W2.

As the first width W1 may be greater than the third width W3, in a process for forming first upper holes 140 described with reference to FIGS. 8 and 9, each of the first upper holes 140 may easily expose an upper surface of each of second sacrificial layers 130, and thus the second structure may have a desired structure.

In some example embodiments, a width in the horizontal direction of a portion of the second structure corresponding to the first gate electrode 332 may be equal to or less than the third width W3. The second structures are, preferably, formed to be close with each other in order to increase the integration degree, however, if the second structures are too close with each other, in a gate replacement process described with reference to FIGS. 15 to 18, a gate electrode may not fill a gap 270 (refer to FIG. 16) between the second structures so that a void may be formed. Thus, in a design step, a minimum and/or a desired distance between the second structures at which the gate electrode may be formed with no void therein may be assured when the second structure has the third width W3, and thus no gate electrode has to be formed at an area in which the second structure has a width greater than the third width W3.

The upper surface of the lower portion of the second structure has the first width W1 greater than the third width W3 of the upper surface of the upper portion thereof, however, the width of the lower portion of the second structure may gradually decrease from a top toward a bottom thereof, and thus the gate electrodes may be formed only at a height at which the lower portion of the second structure has a width equal to or less than the third width W3, so that no void may be formed in the gate electrodes. That is, a width in the horizontal direction of a portion of the second structure corresponding to an upper surface of the first gate electrode 332 at a second level from the upper surface of the substrate 100 may be equal to or less than the third width W3.

The contact plug 370 may be formed on the pad 230, and the bit line 390 may be formed on the contact plug 370. The contact plug 370 may extend through the first and second insulating interlayers 250 and 360 to contact the pad 230, and the bit line 390 may extend through the third insulating interlayer 380 to contact the contact plug 370.

The contact plug 370 and the bit line 390 may include a metal, e.g., copper, aluminum, tungsten, titanium, tantalum, etc., and/or a metal nitride, e.g., titanium nitride, tantalum nitride, tungsten nitride, etc., and the first to third insulating interlayers 250, 360 and 380 may include an insulating material such as an oxide (e.g., silicon oxide).

The division layer 240 may extend in the first direction from the uppermost insulation pattern 115 downwardly to a portion of one of the insulation patterns 115 at a third level from above, and thus the third gate electrode 336 at each level higher than the third level from above may be divided into pieces in the third direction.

In some example embodiments, the division layer 240 may extend in the second direction between two channel blocks in one channel group, and may extend through channels 215 included in the fifth channel column 215e. The division layer 240 may extend in the first direction to a portion of one of the insulation patterns 115 on an uppermost one of the second gate electrodes 334.

The second blocking layer 280 may be formed on lower and upper surfaces and a portion of a sidewall of each of the first to third gate electrodes 332, 334 and 336, and a sidewall of each insulation pattern 115. The second blocking layer 280 may also contact a sidewall of the charge storage structure 195.

FIGS. 4 to 19 are plan views and cross-sectional views illustrating a method of manufacturing a vertical memory device according to some example embodiments. Particularly, FIGS. 5, 8, 13 and 15 are plan views, and FIGS. 4, 6-7, 9-12, 14 and 16-19 are cross-sectional views. FIGS. 4, 6-7, 9-12, 14 and 16-19 are cross-sectional views taken along lines A-A' of corresponding plan views, respectively, and FIG. 14 is a cross-sectional view taken along a line B-B' of FIG. 13.

Figure 4:
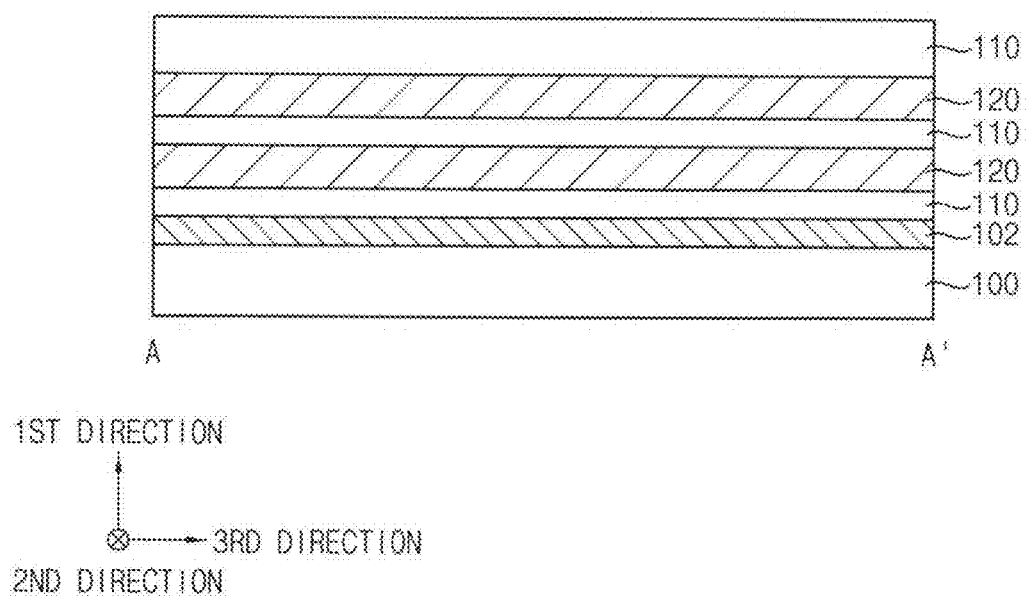
FIGS. 4, 6-7, 9-12, 14, and 16-19 are cross-sectional views illustrating operations in a method of manufacturing a vertical memory device according to some example embodiments.

Referring to FIG. 4, a first impurity region 102 may be formed at an upper portion of a substrate 100, and an insulation layer 110 and a first sacrificial layer 120 may be alternately and repeatedly formed on the first impurity region 102 in the first direction.

The first impurity region 102 may be formed by doping carbon, or one or more p-type impurities, e.g., boron into the upper portion of the substrate 100.

In some example embodiments, the insulation layer 110 may be formed at three levels, and the first sacrificial layer 120 may be formed at two levels, however, inventive concepts are not limited thereto. Ones of the insulation layers 110 and ones of the first sacrificial layers 120 formed by a process described with reference to FIG. 4 may be stacked at levels of which a number is much less than that of levels of ones of the insulation layers 110 and ones of the first sacrificial layers 120 subsequently formed by a process described with reference to FIG. 7.

An uppermost one of the insulation layers 110 may be thicker than other ones of the insulation layers 110 at lower levels, respectively.

The insulation layer 110 and the first sacrificial layer 120 may be formed by a chemical vapor deposition (CVD) process, a plasma enhanced chemical vapor deposition (PECVD) process, an atomic layer deposition (ALD) process, etc. The insulation layer 110 may include an insulating material such as an oxide (e.g., silicon oxide), and the first sacrificial layer 120 may include a different insulating material such as a nitride (e.g., silicon nitride).

Figure 5:
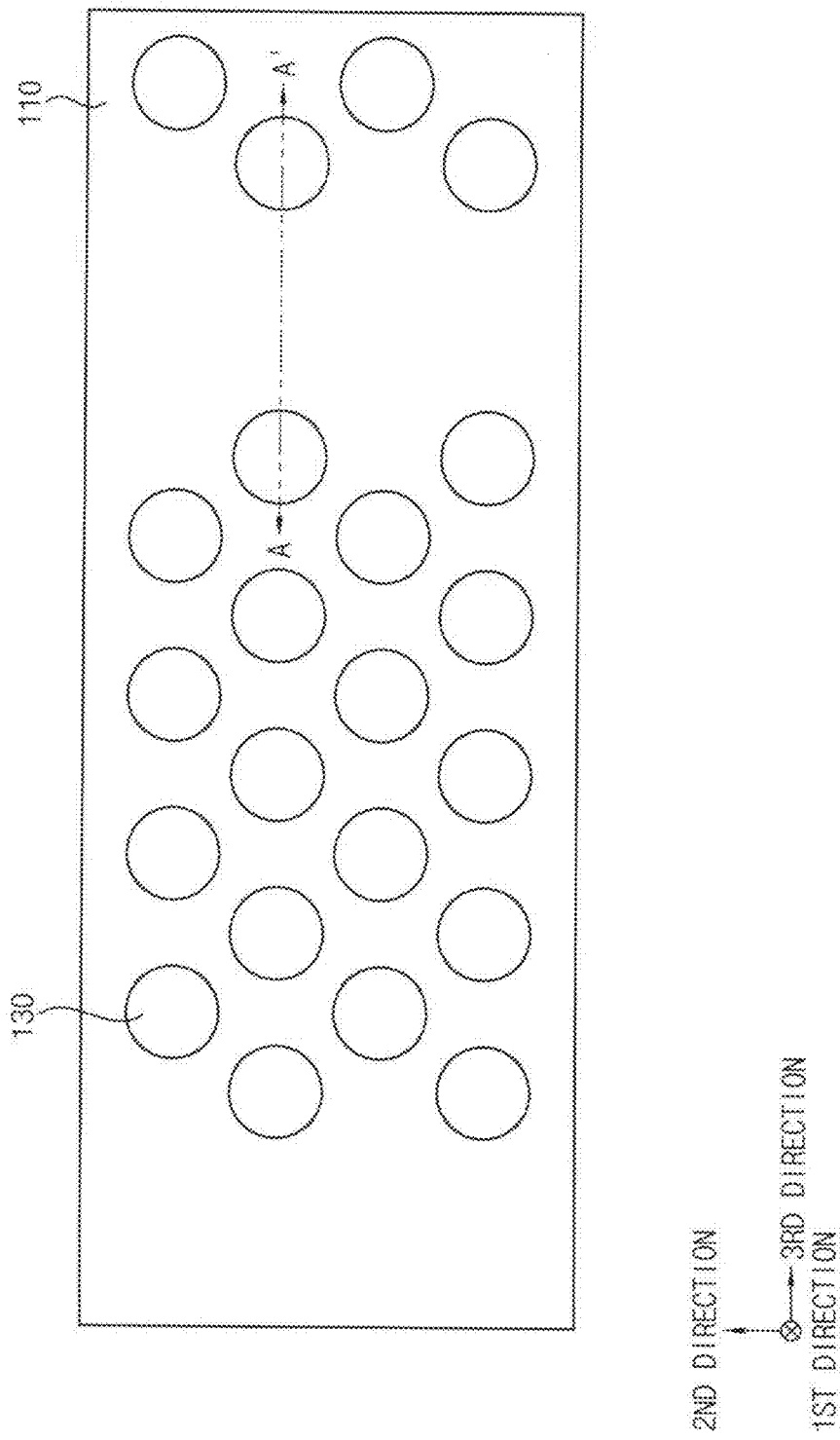
FIGS. 5, 8, 13, and 15 are plan views illustrating operations in a method of manufacturing a vertical memory device according to some example embodiments.
Figure 6:
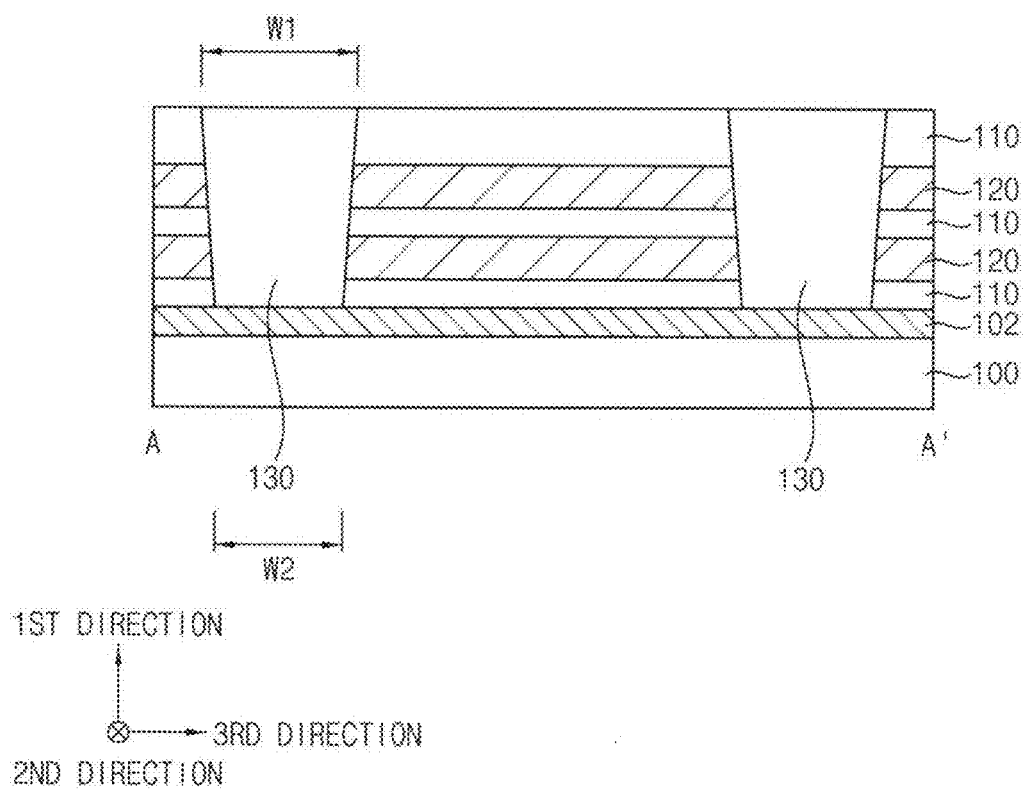

Referring to FIGS. 5 and 6, second sacrificial layers 130 may be formed through the insulation layers 110 and the first sacrificial layers 120 to contact the first impurity region 102 at the upper portion of the substrate 100.

A photoresist pattern (not shown) may be formed on the uppermost one of the insulation layer 110. The insulation layers 110 and the first sacrificial layers 120 may be etched using the photoresist pattern as an etching mask to form first lower holes exposing upper surfaces of the first impurity region 102. The second sacrificial layers 130 may be formed to fill the first lower holes, respectively.

In some example embodiments, the first impurity region 102 may serve as an etch stop layer in the etching process. The first impurity region 102 may include silicon doped with carbon or one or more p-type impurities, and thus the etching selectivity of the first impurity region 102 with respect to the insulation layer 110 and the first sacrificial layer 120 including silicon oxide and silicon nitride, respectively, may be increased when compared to the substrate 100 including silicon. During the etching process for forming the first lower holes, no recess may be formed on the substrate 100. That is, the first lower holes may be formed to have a uniform depth, and the second sacrificial layers 130 filling the first lower holes may have a uniform thickness.

In some example embodiments, due to the general characteristics of the etching process, each of the first lower holes may have a width gradually decreasing from a top toward a bottom thereof. Thus, a sidewall of each of the first lower holes may not be perpendicular, but instead may be slanted with respect to the upper surface of the substrate 100. Accordingly, each of the second sacrificial layers 130 filling each of the first lower holes may also have a slanted sidewall. That is, an upper surface of each of the second sacrificial layers 130 may have a first width W1 in a horizontal direction substantially parallel to the upper surface of the substrate 100, and a lower surface of each of the second sacrificial layers 130 may have a second width W2 less than the first width W1.

In some example embodiments, a plurality of first lower holes may be formed in each of the second and third directions to form a lower hole array. The description of the lower hole array may be replaced with the description of an upper hole array, which will be illustrated subsequently.

The second sacrificial layers 130 may include a material having an etching selectivity with respect to the insulation layer 110 and the first sacrificial layer 120, e.g., polysilicon.

Figure 7:
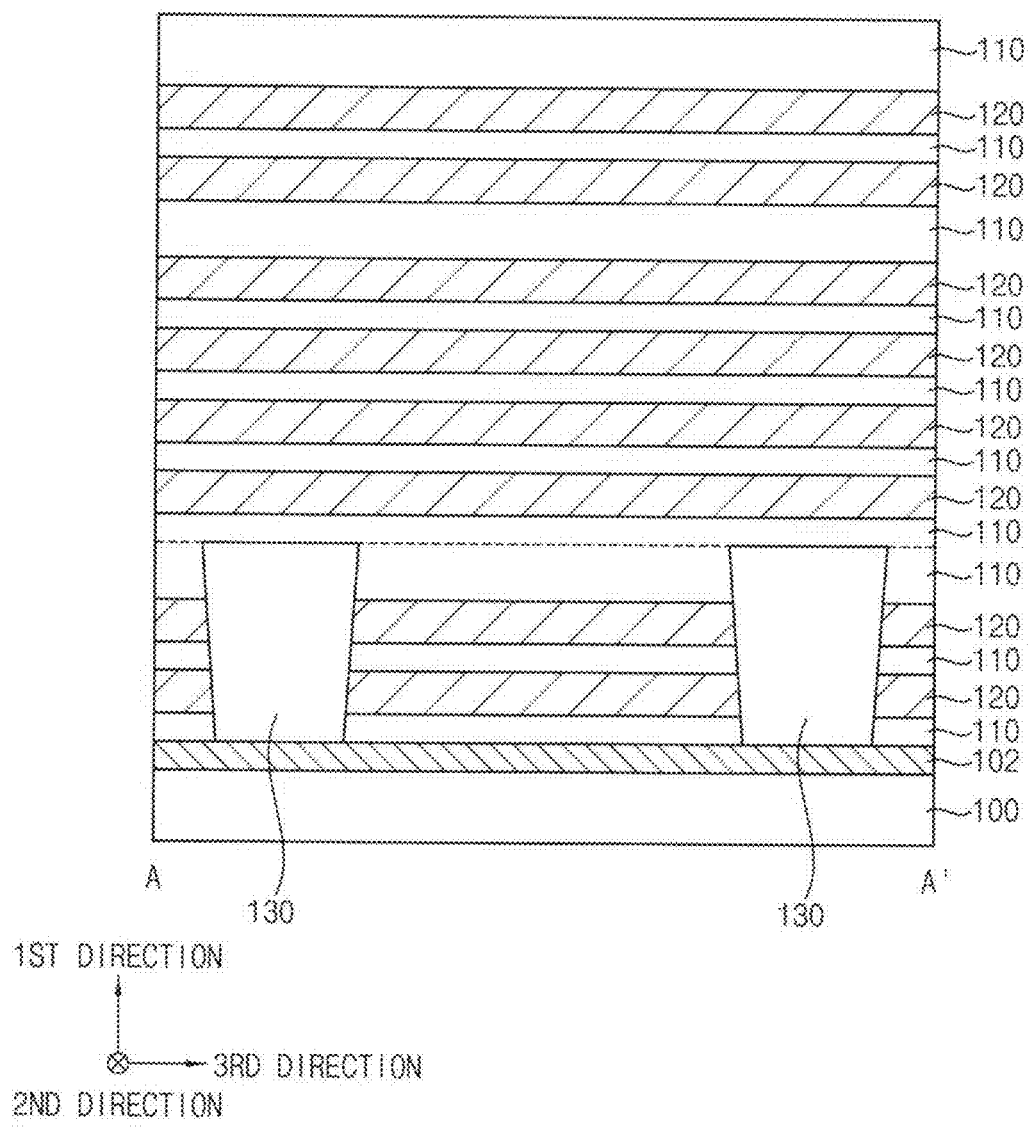

Referring to FIG. 7, the insulation layer 110 and the first sacrificial layer 120 may be again alternately and repeatedly formed on the second sacrificial layers 130 and the uppermost one of the insulation layer 110 previously formed in FIGS. 5 and 6.

FIG. 7 shows the insulation layers 110 are formed at seven levels, respectively, and the first sacrificial layers 120 are formed at six levels, respectively; however, inventive concepts are not limited thereto. Thus, the insulation layers 110 and the first sacrificial layers 120 may be formed at other numbers of levels, respectively.

One of the insulation layers 110 on the second sacrificial layers 130 may be merged with one of the insulation layers 110 covering sidewalls of the second sacrificial layers 130, and one of the insulation layers 110 at a third level from above may be thicker than other ones of the insulation layers 110 at other levels, however, inventive concepts are not limited thereto.

Figure 8:
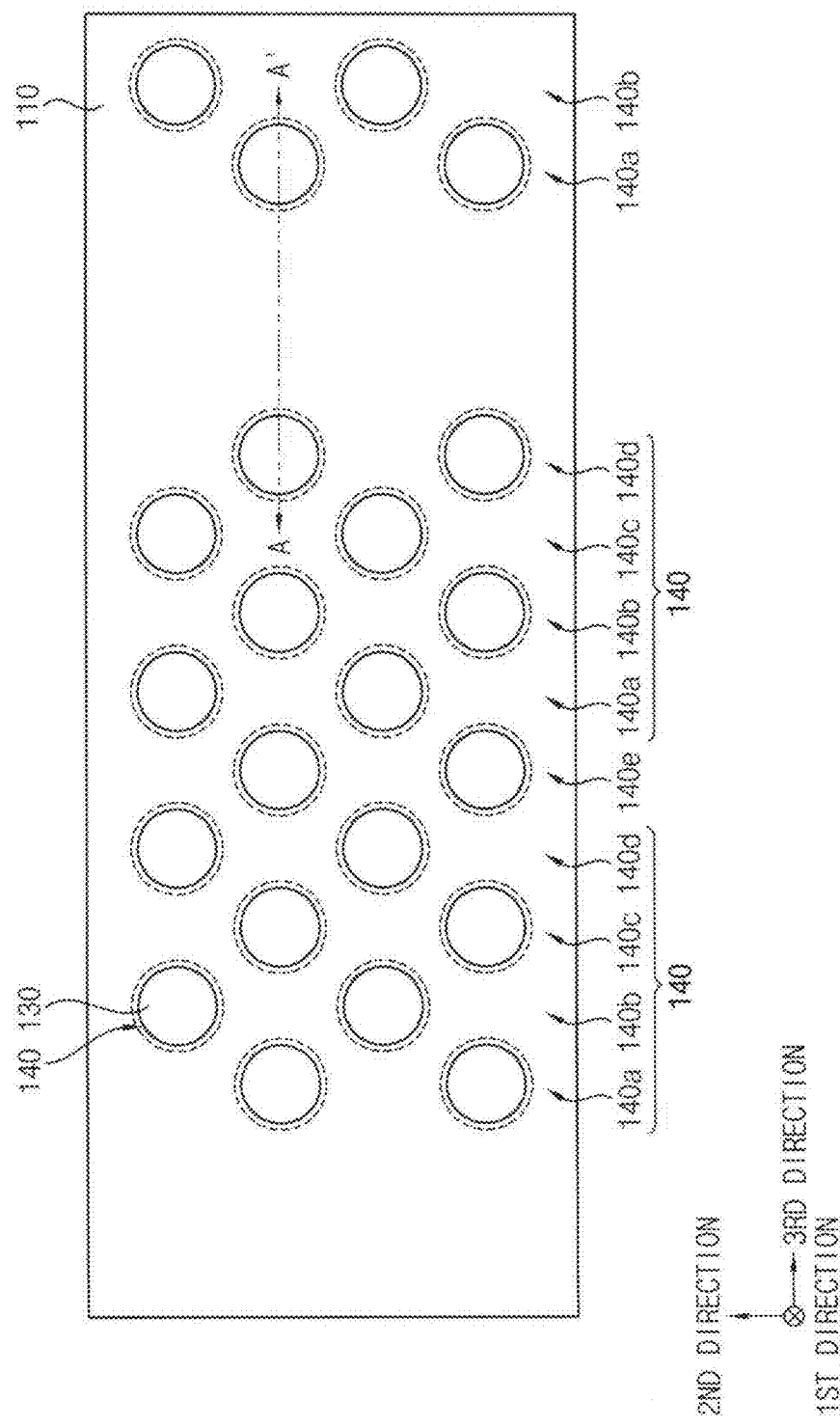
Figure 9:
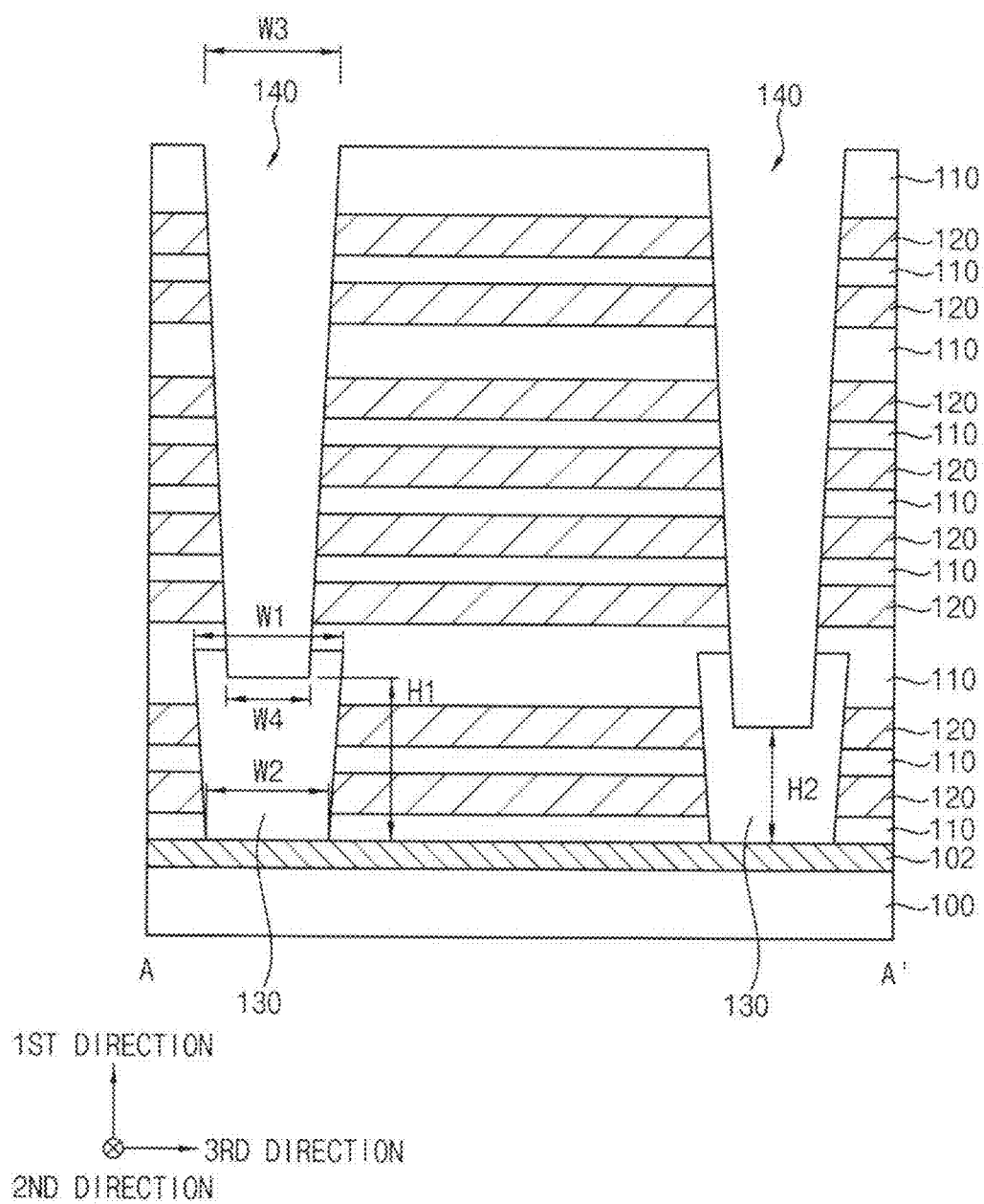

Referring to FIGS. 8 and 9, a photoresist pattern (not shown) may be formed on an uppermost one of the insulation layers 110, and the insulation layers 110 and the first sacrificial layers 120 may be etched using the photoresist pattern as an etching mask to form first upper holes 140 exposing upper surfaces of the second sacrificial layers 130, respectively.

In some example embodiments, each of the first upper holes 140 may have a width gradually decreasing from a top toward a bottom thereof due to the general characteristics of the etching process. Thus, a sidewall of each of the first upper holes 140 may not be perpendicular, but instead may be slanted with respect to the upper surface of the substrate 100. Accordingly, a top of each of the first upper holes 140 may have a third width W3 in the horizontal direction, and a bottom of each of the first upper holes 140 corresponding to the upper surface of each of the second sacrificial layers 130 may have a fourth width W4 less than the third width W3.

In some example embodiments, the third width W3 of the top of each of the first upper holes 140 may be less than the first width W1 of the upper surface of each of the second sacrificial layers 130, and may be greater than the second width W2 of the lower surface of each of the second sacrificial layers 130. Thus, the fourth width W4 of the bottom of the first upper holes 140 corresponding to the upper surface of each of the second sacrificial layers 130 may be also less than the first width W1. In some example embodiments, the fourth width W4 of the bottom of each of the first upper hole 140 may be less than the second width W2 of the lower surface of each of the second sacrificial layers 130.

As the first width W1 of the upper surface of each of the second sacrificial layers 130 may be greater than the fourth width W4 of the bottom of each of the first upper holes 140, each of the first upper holes 140 may easily expose the upper surface of each of the second sacrificial layers 130. Each of the first upper holes 140 may extend through the insulation layers 110 and the first sacrificial layers 120 at a number of levels, and thus may be bent at a lower portion thereof, and each of the first upper holes 140 may not exactly formed on the upper surface of each of the second sacrificial layers 130 due to the misalignment. However, the first width W1 of the upper surface of each of the second sacrificial layers 130 may be large, and thus each of the first upper holes 140 may easily expose the upper surface of each of the second sacrificial layers 130 even with the above phenomenon.

The first upper holes 140 may have a depth distribution in order that each of the plurality of first upper holes 140 may expose the upper surface of each of the second sacrificial layers 130, and thus the bottoms of the first upper holes 140 may have a height distribution in the second sacrificial layers 130. FIG. 9 shows the first upper holes 140 having bottoms at first and second heights H1 and H2, respectively. However, the second sacrificial layers 130 may be subsequently removed, and thus the characteristics of the channels that may be formed in the first upper holes 140 may not be changed, even if the first upper holes 140 may have the depth distribution.

In order to increase the integration degree, the number of the first upper holes 140 per a unit area may be increased so as to form as many channels as possible. However, if the distance between the channels is reduced too much, in a gate replacement process described with reference to FIGS. 16 to 18, gate electrodes may not be formed well in a gap 270 (refer to FIG. 16) that may be formed by removing the first sacrificial layers 120.

Thus, the third width W3 of the top of each of the first upper holes 140 may be determined based on the maximum distance between the first upper holes 140 at which the gate electrodes may be well formed between the channels. Additionally, the first width W1 of the upper surface of each of the second sacrificial layers 130 corresponding to each of the first upper holes may be greater than the third width W3, however, each of the second sacrificial layers 130 may have a slanted sidewall having a decreasing width in the horizontal direction from a top toward a bottom thereof, and thus the first sacrificial layers 120 may be formed at a height at which a width of each of the second sacrificial layers 130 in the horizontal direction may be equal to or less than the third width W3, so that the gate electrodes may be well formed in the gap 270.

Accordingly, in some example embodiments, a width in the horizontal direction of a portion of the second sacrificial layer 130 corresponding to an upper surface of one of the first sacrificial layers 120 at a second level from the upper surface of the substrate 100 may be equal to or less than the third width W3 of the top of each of the first upper holes 140.

A plurality of first upper holes 140 may be formed in each of the second and third directions, and thus a upper hole array may be defined. In some example embodiments, the upper hole array may include a first upper hole column 140a including first upper holes 140 disposed in the second direction, and a second upper hole column 140b including first upper holes 140 disposed in the second direction and being spaced apart from the first upper hole column 140a in the third direction. The first upper holes 140 included in the first upper hole column 140a may be disposed to have acute angles with the second direction or the third direction from the first upper holes 140 included in the second upper hole column 140b.

The first and second upper hole columns 140a and 140b may be alternately and repeatedly arranged in the third direction. In some example embodiments, five first upper hole columns 140a and four second upper hole columns 140b may be alternately arranged in the third direction, which may form one upper hole group.

Hereinafter, four upper hole columns disposed in the third direction in one upper hole group may be referred to as first, second, third and fourth upper hole columns 140a, 140b, 140c and 140d, respectively, in this order, one upper hole column at a central position in the third direction in the upper hole group may be referred to as a fifth upper hole column 140e, and the other four upper hole columns disposed in the third direction in the upper hole group may be referred to as the first, second, third and fourth upper hole columns 140a, 140b, 140c and 140d, respectively, again in this order. The first to fourth upper hole columns 140a, 140b, 140c and 140d disposed in the third direction may define an upper hole block.

Figure 10:
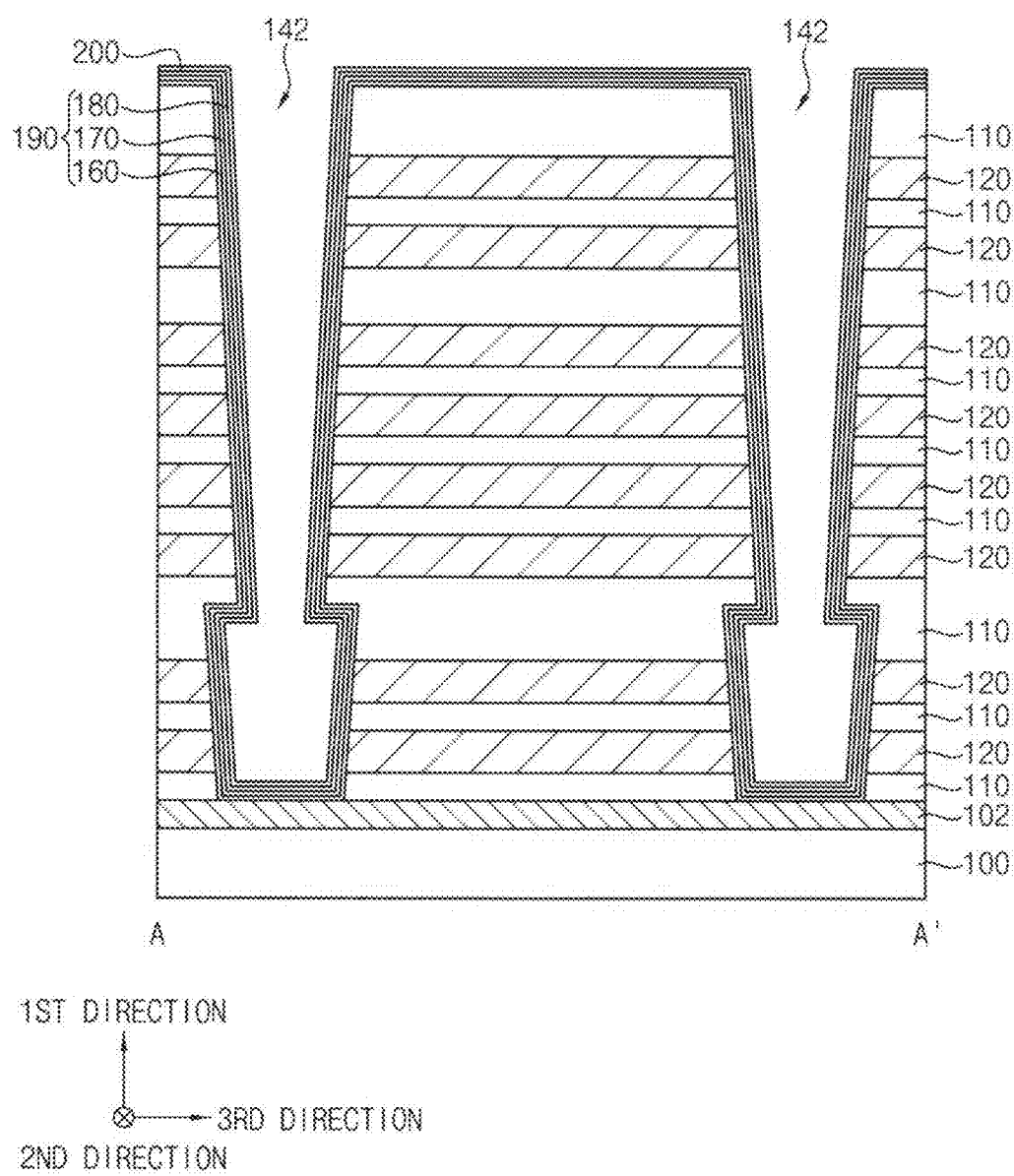

Referring to FIG. 10, the second sacrificial layers 130 exposed by the first upper holes 140 may be removed so that the first lower holes may be formed again.

The lower holes may be formed by removing the second sacrificial layers 130 previously formed through the insulation layers 110 and the first sacrificial layers 120, so as to be limited to the size of the second sacrificial layers 130.

Hereinafter, the first lower hole and the first upper hole 140 may be referred to as a first channel hole 142. The first channel hole 142 may include lower and upper portions connected with each other, and each of the lower and upper portions of the first channel hole 142 may have a slanted sidewall.

A charge storage structure layer 190 and a third sacrificial layer 200 may be sequentially formed on a sidewall of the first channel hole 142, the upper surface of the first impurity region 102, and an upper surface of the uppermost one of the insulation layer 110.

In some example embodiments, the charge storage structure layer 190 may include a first blocking layer 160, a charge storage layer 170, and a tunnel insulation layer 180 sequentially stacked. For example, the first blocking layer 160, the charge storage layer 170, and the tunnel insulation layer 180 may include silicon oxide, silicon nitride, and silicon oxide, respectively, and the third sacrificial layer 200 may include, e.g., polysilicon.

Figure 11:
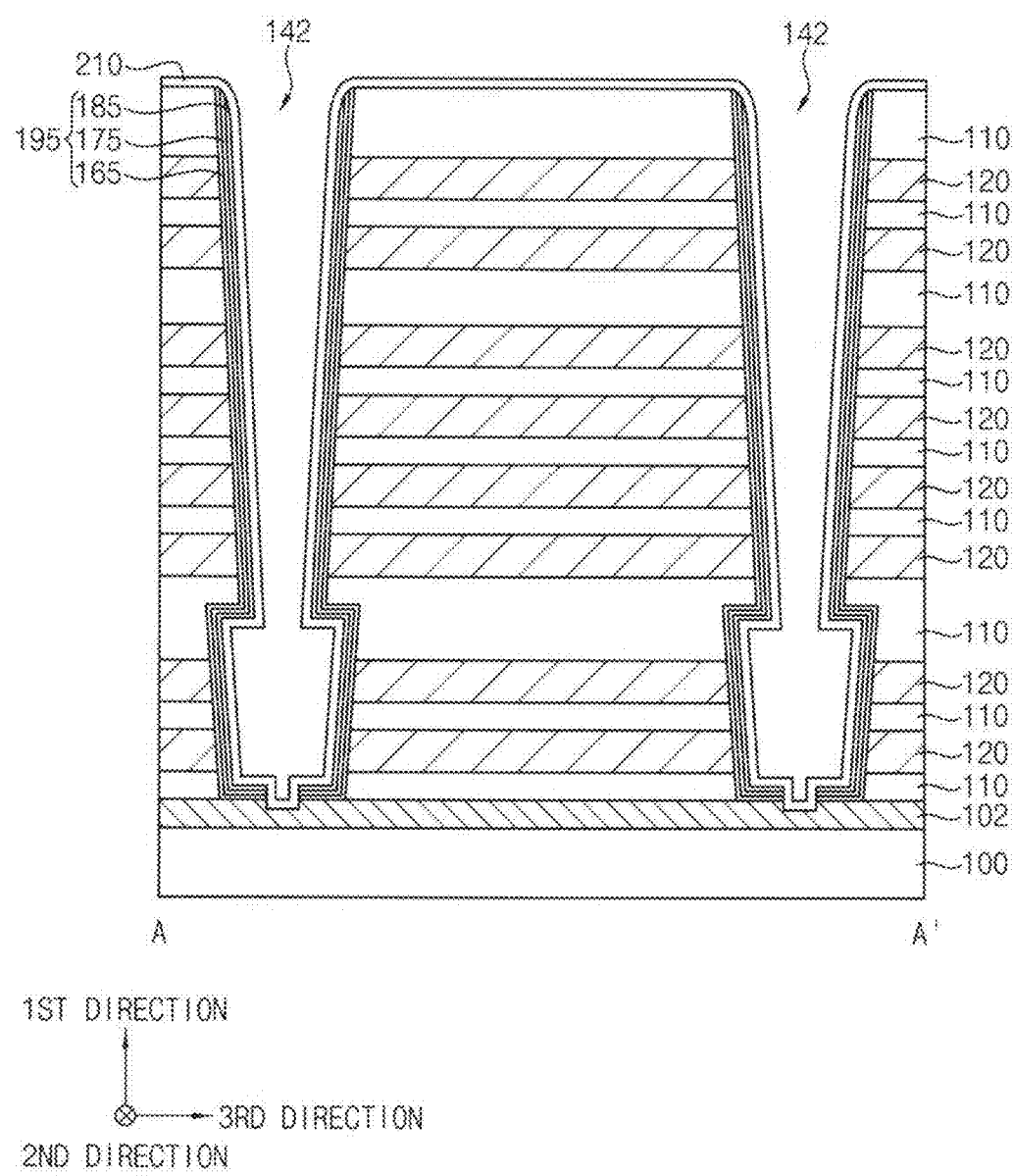

Referring to FIG. 11, a first spacer layer (not shown) may be formed on the third sacrificial layer 200, and may be anisotropically etched to form a first spacer (not shown) on the sidewall of the first channel hole 142.

The third sacrificial layer 200, the tunnel insulation layer 180, the charge storage layer 170, and the first blocking layer 160 may be sequentially etched using the first spacer as an etching mask to form a third sacrificial pattern (not shown), a tunnel insulation pattern 185, a charge storage pattern 175, and a first blocking pattern 165, respectively, having a cup-like shape of which a bottom is opened on the sidewall of the first channel hole 142 and the first impurity region 102. An upper portion of the first impurity region 102 may be also removed. The tunnel insulation pattern 185, the charge storage pattern 175 and the first blocking pattern 165 may form a charge storage structure 195.

After removing the first spacer and the third sacrificial pattern, a channel layer 210 may be formed on the exposed first impurity region 102, the tunnel insulation pattern 185, and the uppermost one of the insulation layer 110. The channel layer 210 may include polysilicon or amorphous silicon. When the channel layer 210 include amorphous silicon, a laser epitaxial growth (LEG) process or a solid phase epitaxy (SPE) process may be performed so that the channel layer 210 may include crystalline silicon.

Figure 12:
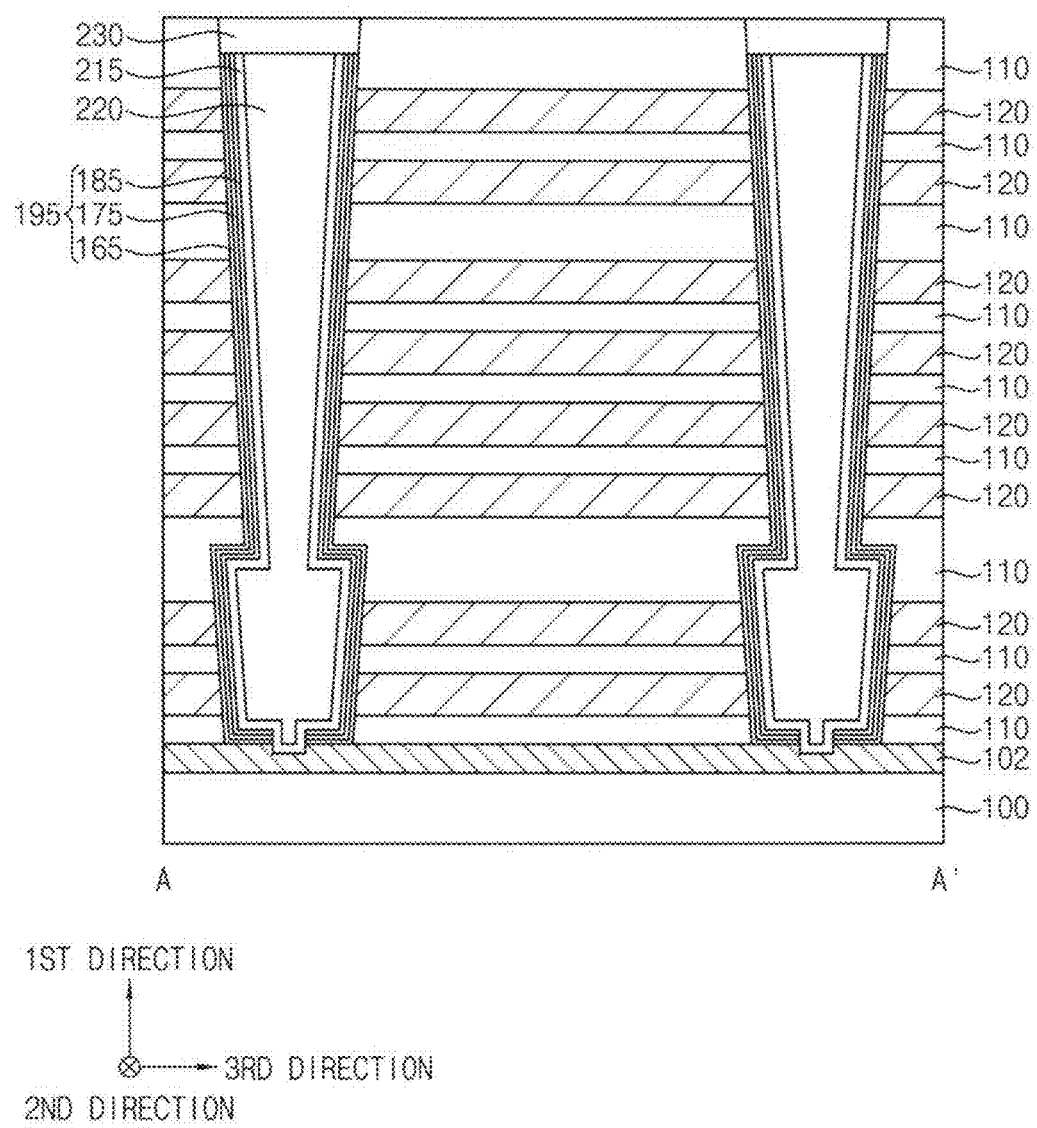

Referring to FIG. 12, a filling layer may be formed on the channel layer 210 to fill the first channel hole 142, and the filling layer and the channel layer 210 may be planarized until the uppermost one of the insulation layers 110 may be exposed, so that a filling pattern 220 filling the first channel hole 142 may be formed and the channel layer 210 may be transformed into a channel 215.

Thus, the charge storage structure 195, the channel 215, and the filling pattern 220 may be sequentially stacked on the first impurity region 102 in the first channel hole 142.

As the first upper holes 140 included in the first channel hole 142 defines the first to fifth upper hole columns 140a, 140b, 140c, 140d and 140e, the upper hole block, the upper hole group, and the upper hole array, the channels 215 in the first channel hole 142 may also define first to fifth channel columns 215a, 215b, 215c, 215d and 215e (see FIG. 15), a channel block, a channel group, and a channel array.

The channel 215 having a hollow cylindrical shape, the charge storage structure 195 covering an outer sidewall of the channel 215, and the filling pattern filling an inner space defined by an inner sidewall of the channel 215 may form a first structure having a pillar shape.

An upper portion of the first structure may be removed to form a trench, and a pad 230 may be formed to fill the trench.

In some example embodiments, the pad 230 may include polysilicon or amorphous silicon doped with impurities, and when the pad 230 includes amorphous silicon, a crystallization process may be further performed.

Hereinafter, the first structure and the pad 230 thereon may be referred to as a second structure.

Figure 13:
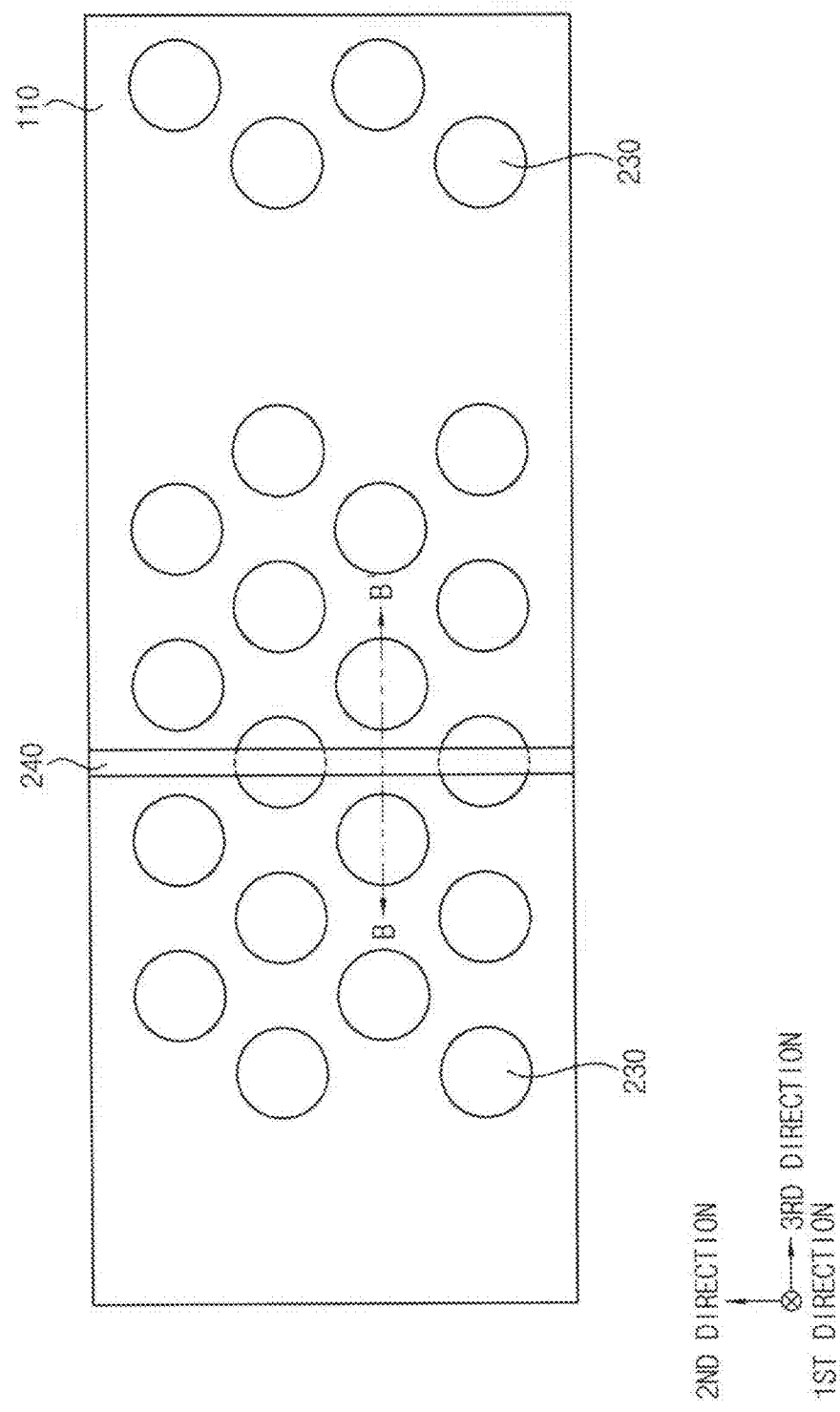
Figure 14:
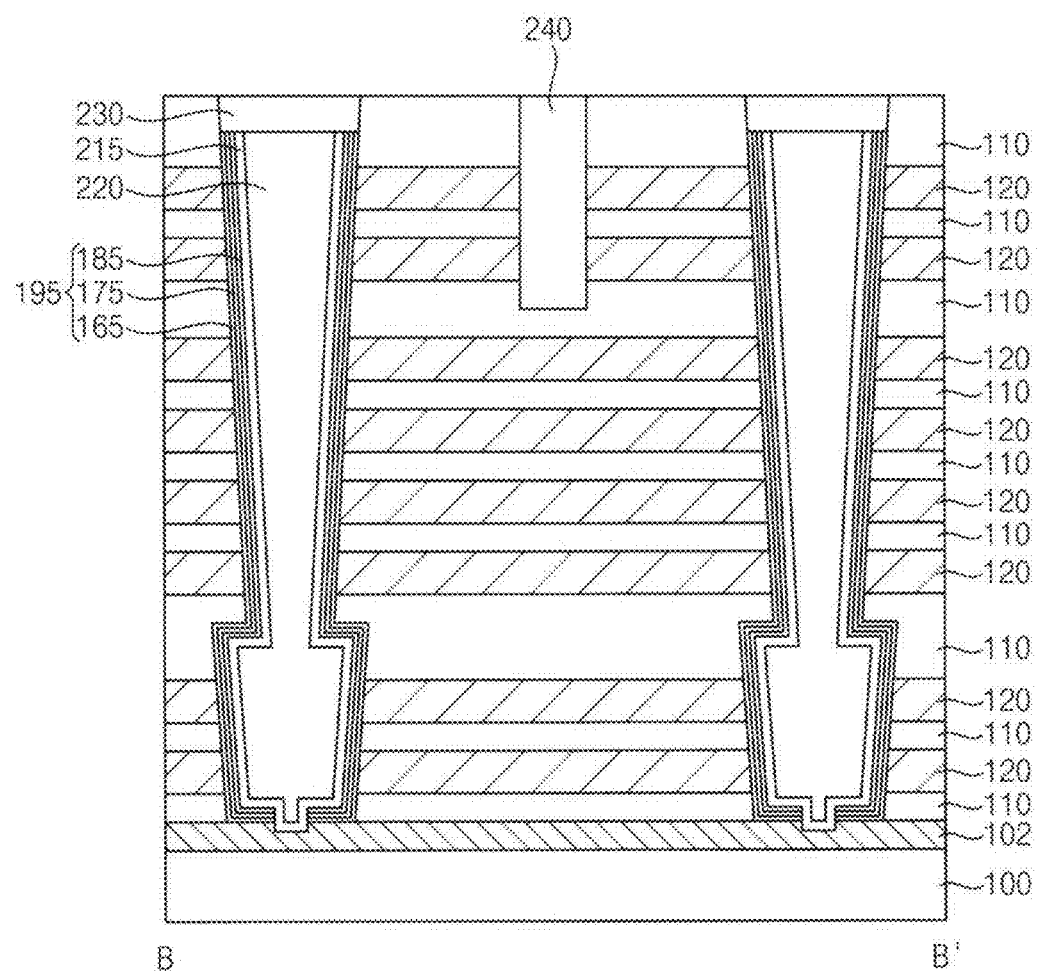

Referring to FIGS. 13 and 14, a division layer 240 may be formed through the first sacrificial layers 120 and the insulation layers 110 at upper levels.

The division layer 240 may be formed by forming an etching mask (not shown) on the uppermost one of the insulation layers 110, etching the first sacrificial layers 120 and the insulation layers 110 using the etching mask to form a first opening (not shown) therethrough, and filling the first opening. In some example embodiments, the first opening may extend to a portion of the insulation layer 110 at a third level from above, however, inventive concepts are not limited thereto. Ones of the first sacrificial layers 120 at upper levels may be divided by the division layer 240.

In some example embodiments, the division layer 240 may extend in the second direction between two channel blocks in one channel group, and may extend through upper portions of the channels 215 included in the fifth channel column 215e.

Figure 15:
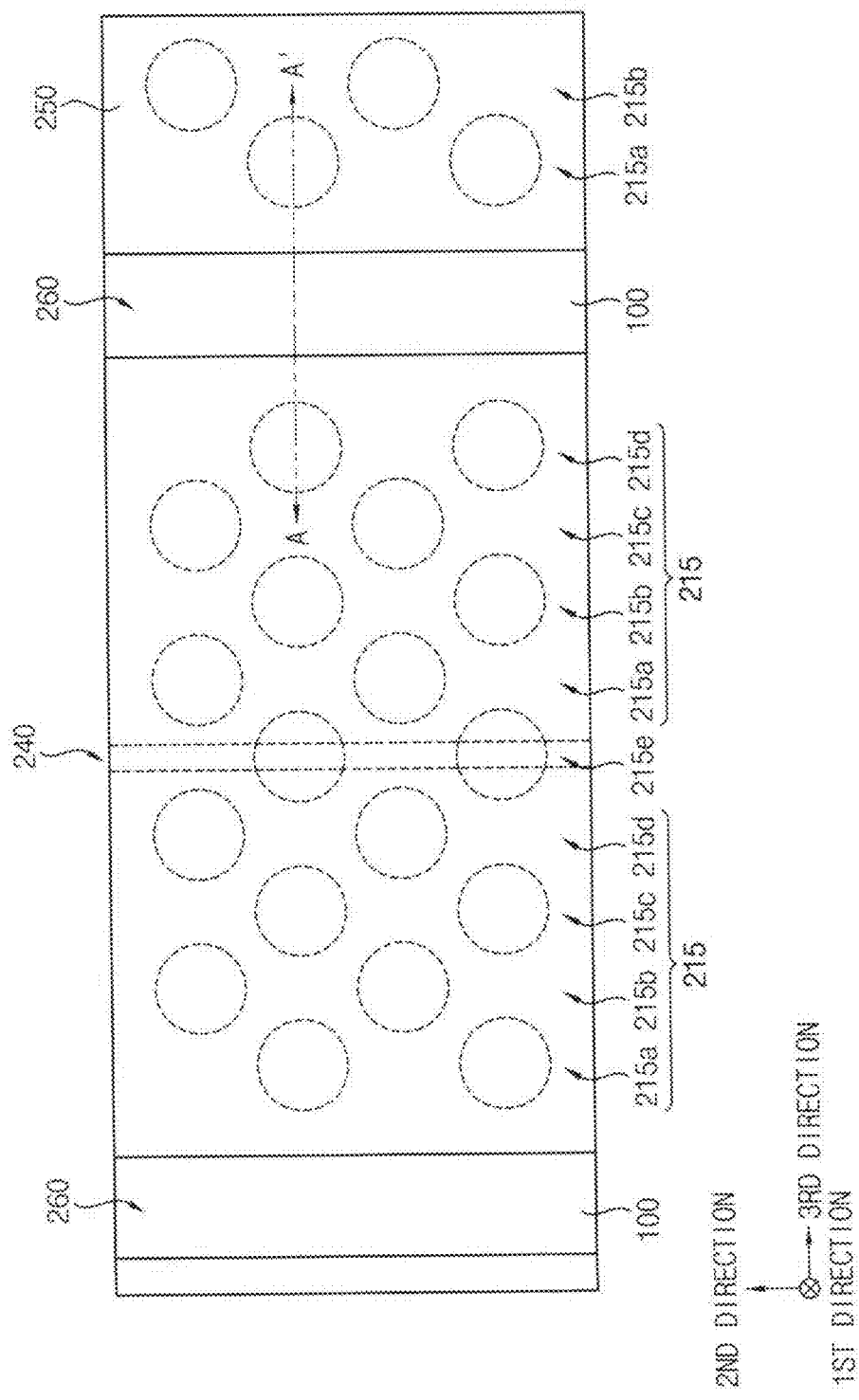
Figure 16:
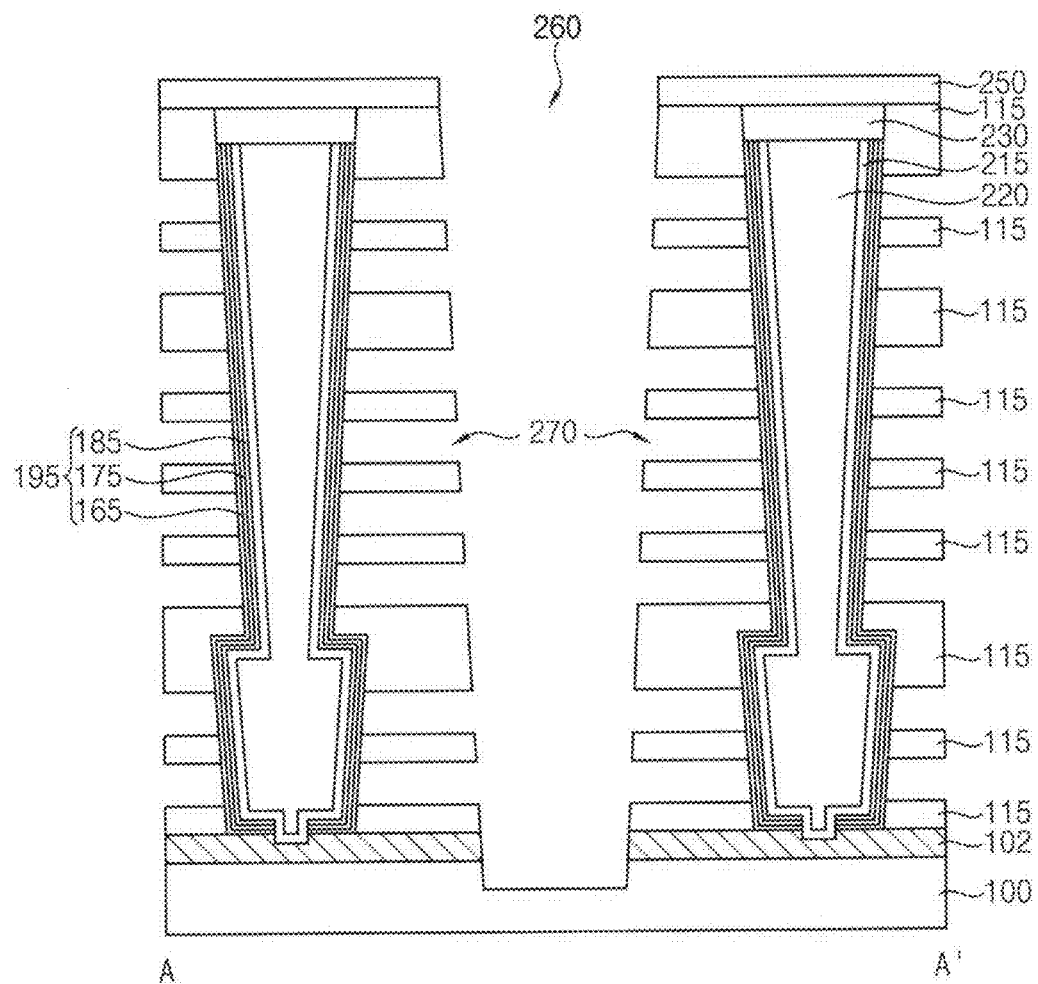

Referring to FIGS. 15 and 16, a first insulating interlayer 250 may be formed on the uppermost insulation layer 110, the pad 230, and the division layer 240, and a second opening 260 may be formed through the first insulating interlayer 250, the insulation layers 110, the first sacrificial layers 120, and the first impurity region 102, and a portion of the substrate 100 under the first impurity region 102 may be also removed.

In some example embodiments, the second opening 260 may extend in the second direction between the channel groups, and a plurality of second openings 260 may be formed in the third direction. That is, one channel group may be disposed between neighboring ones of the second openings 260 in the third direction, and the channel group may include two channel blocks each including four channel columns at each of opposite sides of the fifth channel column 215e in the third direction.

As the second opening 260 may be formed, the insulation layers 110 may be transformed into insulation patterns 115 each extending in the second direction, and the first sacrificial layers 120 may be transformed into first sacrificial patterns (not shown) each extending in the second direction.

The first sacrificial patterns exposed by the second opening 260 may be removed to form a gap 270 between the insulation patterns 115 at respective levels. A portion of an outer sidewall of the first blocking pattern 165 may be exposed by the gap 270.

In some example embodiments, the first sacrificial patterns exposed by the second opening 260 may be removed by a wet etching process using an etchant including phosphoric acid and/or sulfuric acid.

Figure 17:
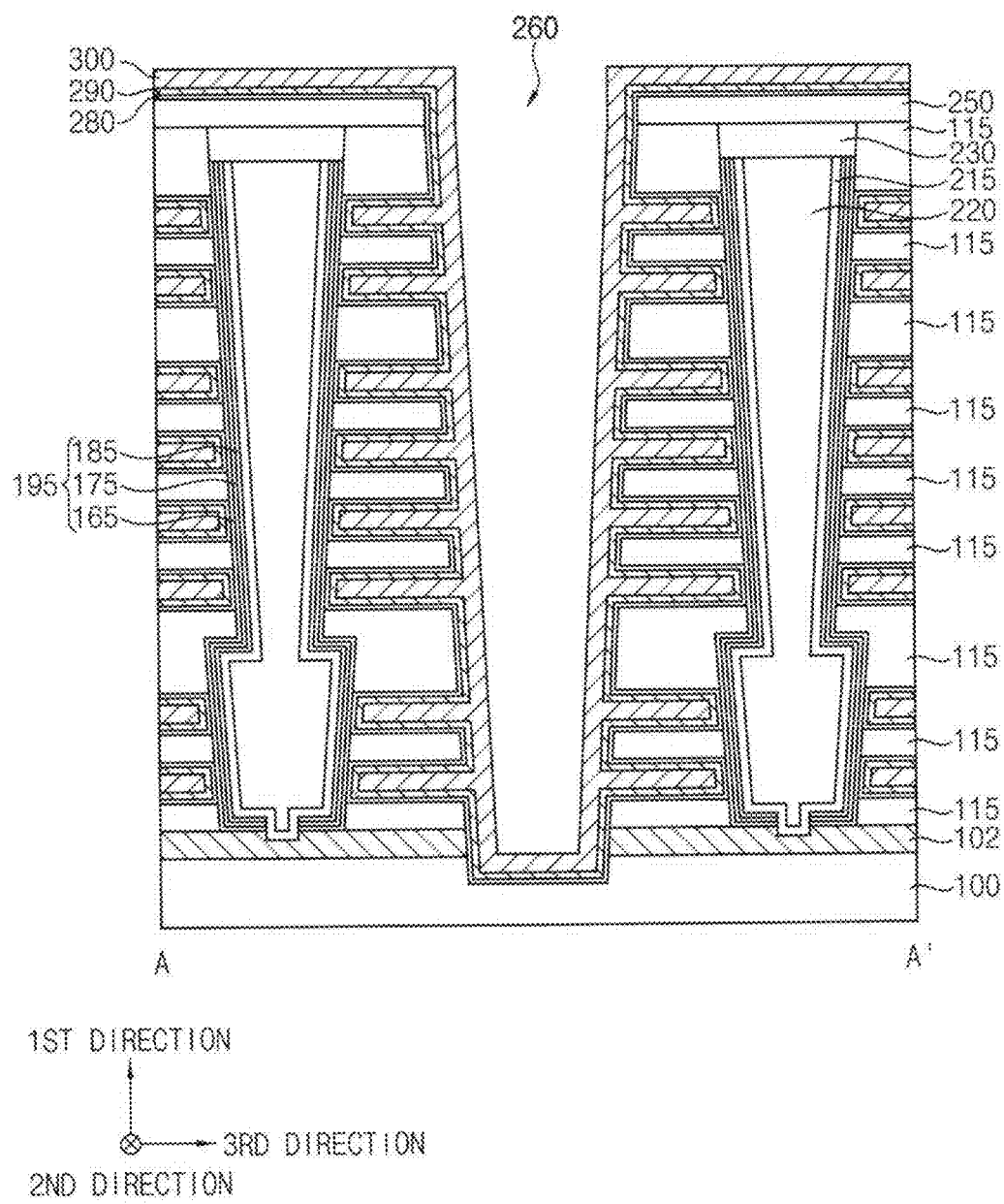

Referring to FIG. 17, after a second blocking layer 280 may be formed on the exposed portion of the outer sidewall of the first blocking pattern 165, an inner wall of the gap 270, surfaces of the insulation patterns 115, an upper surface of the substrate 100, and an upper surface of the first insulating interlayer 250, a gate barrier layer 290 may be formed on the second blocking layer 280, and a gate conductive layer 300 may be formed on the gate barrier layer 290 to fill a remaining portion of the gap 270.

As illustrated above, the second structures may be spaced apart from each other by a proper distance, and thus the gate conductive layer 300 may fill the gap 270 well even between the second structures. That is, each of the second structures may include the lower and upper portions, and the gap 270 may be formed only at an area of the lower portion of the second structure having a width smaller than the third width W3, which may be the maximum width of the upper portion of the second structure. When each of the second structures includes a width equal to or smaller than the third width W3, the gap 270 may be well filled with the gate conductive layer 300; and thus the gate conductive layers 300 at lower levels may be formed with no void therein.

In some example embodiments, the second blocking layer 280 may include a metal oxide, e.g., aluminum oxide, hafnium oxide, zirconium oxide, etc., the gate barrier layer may include a metal nitride, e.g., titanium nitride, tantalum nitride, etc., and the gate conductive layer 300 may include a metal having a low electrical resistance, e.g., tungsten, titanium, tantalum, etc.

Figure 18:
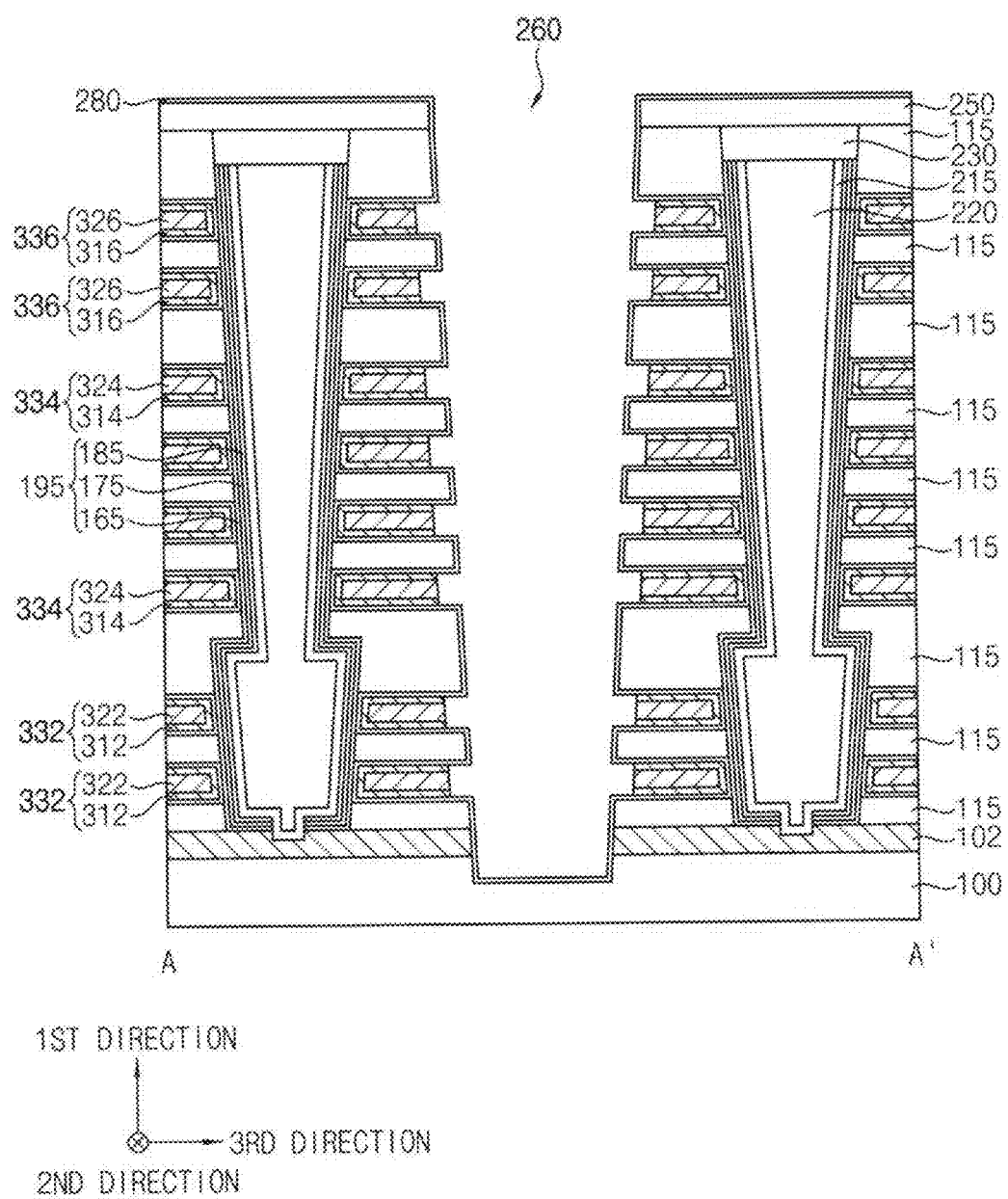

Referring to FIG. 18, the gate conductive layer 300 and the gate barrier layer 290 may be partially removed to form a gate conductive pattern and a gate barrier pattern, respectively, in the gap 270, which may form a gate electrode. In some example embodiments, the gate conductive layer 300 and the gate barrier layer 290 may be removed by a wet etching process, and thus the gate electrode may partially fill the gap 270.

The gate electrode may extend in the second direction, and a plurality of gate electrodes may be formed in the third direction. Thus, the gate electrodes each extending in the second direction may be spaced apart from each other by the second opening 260.

In some example embodiments, the gate electrodes may be formed at a plurality of levels, respectively, spaced apart from each other in the first direction, and may form a gate electrode structure. The gate electrode structure may include at least one first gate electrode 332, a plurality of second gate electrodes 334, and at least one third gate electrode 336 sequentially stacked. The number of levels at which each of the first to third gate electrodes 332, 334 and 336 are formed may be changed.

FIG. 18 shows two first gate electrodes 332 at two levels, respectively, four second gate electrodes 334 at four levels, respectively, and two third gate electrodes 336 at two levels, respectively; however, inventive concepts are not limited thereto. For example, the second gate electrode 334 may be formed at a large number of levels, respectively.

In some example embodiments, the first gate electrode 332 may serve as a ground selection line (GSL), the second gate electrode 334 may serve as a word line, and the third gate electrode 336 may serve as a string selection line (SSL). Some of the second gate electrodes 334 adjacent the first gate electrode 332 and/or the third gate electrode 336 may serve as a dummy word line.

Figure 19:
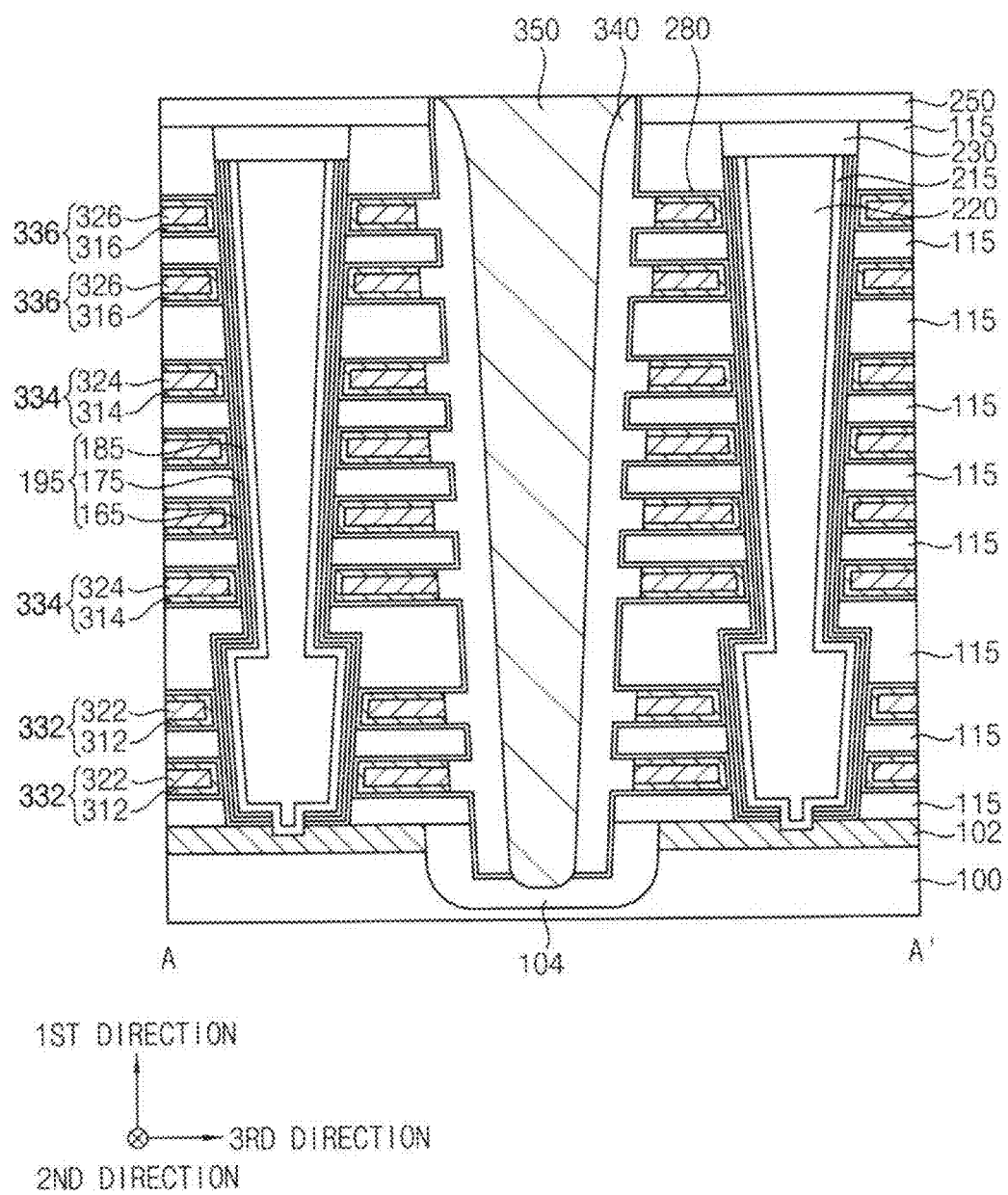

Referring to FIG. 19, impurities may be implanted into an upper portion of the substrate 100 through a portion of the second blocking layer 280 exposed as the gate conductive layer 300 and the gate barrier layer 290 are partially removed, so that a second impurity region 104 may be formed. In some example embodiments, the impurities may include n-type impurities, e.g., phosphorous, arsenic, etc.

A second spacer layer may be formed on the second blocking layer 280, and may be anisotropically etched to form a second spacer 340 on a sidewall of the second opening 260, and thus a portion of the second blocking layer 280 on the second impurity region 104 may be exposed.

The second blocking layer 280 may be etched using the second spacer 340 as an etching mask, and a portion of the second blocking layer 280 on the first insulating interlayer 250 may be also removed. Upper portions of the second impurity region 104 at the upper portion of the substrate 100 may be also partially removed.

A conductive layer may be formed on the upper surface of the second impurity region 104, the second spacer 340, and the first insulating interlayer 250, and may be planarized until the upper surface of the first insulating interlayer 250 may be exposed to form a CSL 350.

In some example embodiments, the CSL 350 may extend in the first direction, and extend in the second direction as well. A lower surface of the CSL 350 may be covered by the second impurity region 104.

Referring to FIGS. 1 to 3 again, a second insulating interlayer 360 may be formed on the first insulating interlayer 250, the CSL 350, the second spacer 340, and the second blocking layer 280, and a contact plug 370 may be formed through the first and second insulating interlayers 250 and 360 to contact an upper surface of the pad 230. A third insulating interlayer 380 may be formed on the second insulating interlayer 360 and the contact plug 370, and a bit line 390 may be formed through the third insulating interlayer 380 to contact an upper surface of the contact plug 370.

In some example embodiments, the bit line 390 may extend in the third direction, and a plurality of bit lines 390 may be formed in the second direction.

The vertical memory device may be manufactured by the above processes.

As illustrated above, after forming the first impurity region 102 at the upper portion of the substrate 100, the insulation layer 110 and the first sacrificial layer 120 may be alternately and repeatedly formed at a several levels, and the first lower holes may be formed through the insulation layers 110 and the first sacrificial layers 120 to expose the first impurity region 102. The first impurity region 102 may serve as an etch stop layer, and thus the first lower holes may have a uniform depth, and thus no recess may be formed on the substrate 100.

After forming the second sacrificial layers 130 to fill the first lower holes, respectively, the insulation layers 110 and the first sacrificial layers 120 may be alternately and repeatedly formed at a plurality of levels, and the first upper holes 140 may be formed through the insulation layers 110 and the first sacrificial layers 120. The upper surface of each of the second sacrificial layers 130 may have the first width W1 greater than the third width W3, which may be the maximum width of each of the first upper holes 140; and thus, even if bending or misalignment may occur during the first upper holes 140, each of the first upper holes 140 may expose each of the second sacrificial layers 130.

The second sacrificial layers 130 may be removed to form the charge storage structure 195 and the channel 215 in the first channel hole 142 including the first lower hole and the first upper hole 140, and thus, even if the first upper holes 140 have the depth distribution, the characteristics of the charge storage structure 195 and the channel 215 may not be deteriorated.

Figure 20:
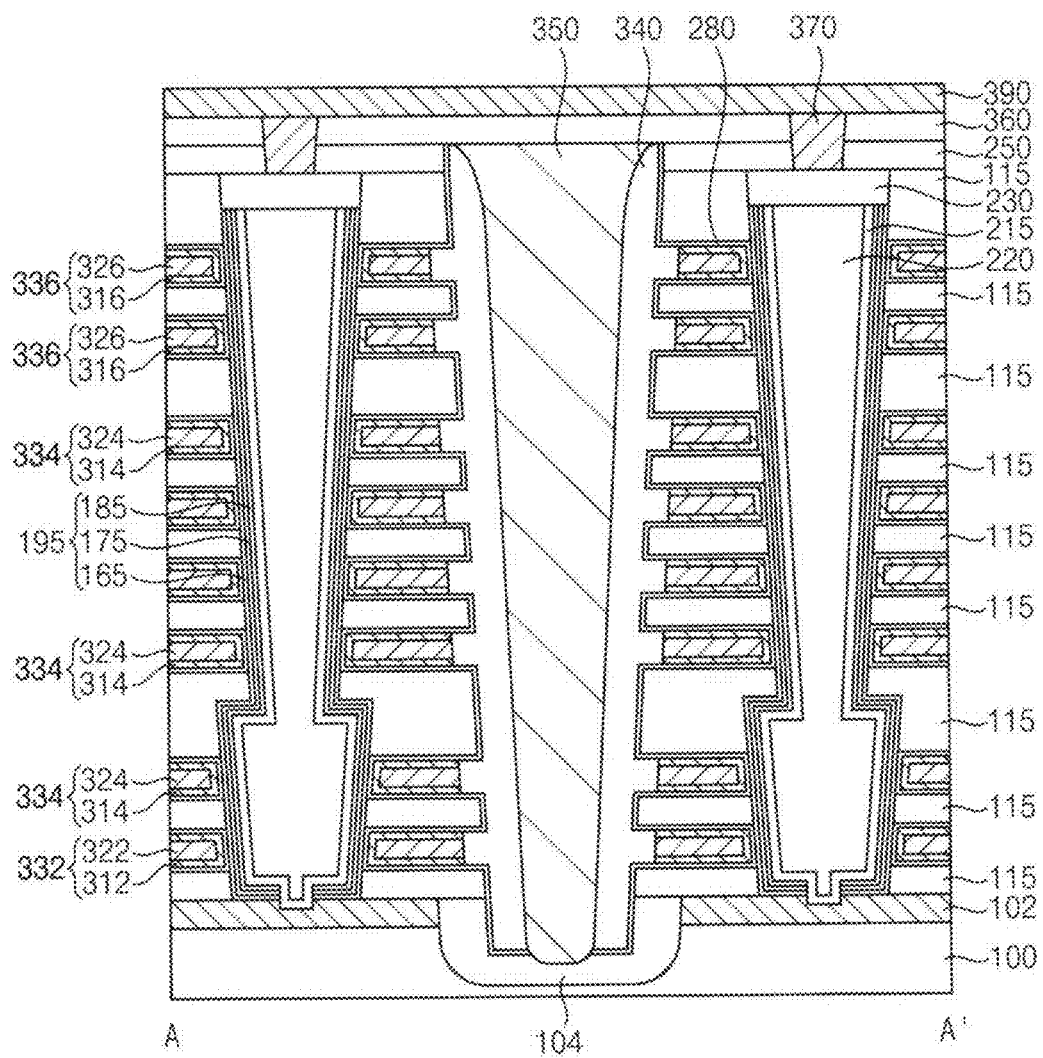
FIG. 20 is a cross-sectional view illustrating a vertical memory device according to some example embodiments.

FIG. 20 is a cross-sectional view illustrating a vertical memory device according to some example embodiments. FIG. 20 is a cross-sectional view taken along a line A-A' of FIG. 1.

This vertical memory device may be substantially the same as that of FIGS. 1 to 3, except for the first and second gate electrodes. Thus, like reference numerals refer to like elements, and detailed descriptions thereon are omitted herein.

Referring to FIG. 20, the first gate electrode 332 in the gate structure of the vertical memory device may be formed at a lowermost level from the upper surface of the substrate 100, and the second gate electrode 334 may be formed at a second level from the upper surface of the substrate 100.

That is, in the vertical memory device described with reference to FIGS. 1 to 3, the first gate electrode 332 serving as the GSL may be formed at two levels from the upper surface of the substrate 100; however, in the vertical memory device described with reference to FIG. 20, the first gate electrode 332 serving as the GSL may be formed only at one level, e.g., the lowermost level from the upper surface of the substrate 100. One of the second gate electrodes 334 at a level directly above the level of the first gate electrode 332 may serve as a dummy word line.

FIG. 21 is a cross-sectional view illustrating a vertical memory device according to some example embodiments. FIG. 21 is a cross-sectional view taken along a line A-A' of FIG. 1.

This vertical memory device may be substantially the same as that of FIGS. 1 to 3, except for the shape of the second structure. Thus, like reference numerals refer to like elements, and detailed descriptions thereon are omitted herein.

Referring to FIG. 21, the second structure of the vertical memory device may include first, second, third and fourth portions sequentially stacked on the substrate 100.

In some example embodiments, upper surfaces of the first and third portions of the second structure may have substantially the same width as each other, and lower surfaces of the first and third portions of the second structure may have substantially the same width as each other. Additionally, upper surfaces of the second and fourth portions of the second structure may have substantially the same width as each other, and lower surfaces of the second and fourth portions of the second structure may have substantially the same width as each other.

In some example embodiments, the first and second portions of the second structure may have substantially the same shapes as those of the lower and upper portions of the second structure described with reference to FIGS. 1 to 3. Additionally, the third and fourth portions of the second structure may have substantially the same shapes as those of the lower and upper portions of the second structure described with reference to FIGS. 1 to 3.

That is, the second structure of FIG. 21 may be similar to a stacked structure including a plurality of second structures of FIG. 2 sequentially stacked. However, the first gate electrode 332 may be formed at a height corresponding to the first portion of the second structure, the second gate electrode 334 may be formed at a height corresponding to the second and third portions and a lower portion of the fourth portion of the second structure, and the third gate electrode 336 may be formed at a height corresponding to an upper portion of the fourth portion of the second structure.

In the figure, the second structure includes the first to fourth portions sequentially stacked, however, inventive concepts are not limited thereto, and the second structure may include a plurality of portions, e.g., an even number of portions sequentially stacked.

FIGS. 22 to 25 are cross-sectional views illustrating a method of manufacturing a vertical memory device according to some example embodiments. This method may be substantially the same as or similar to that described with reference to FIGS. 4 to 19, and thus detailed descriptions thereon are omitted herein.

Figure 22:
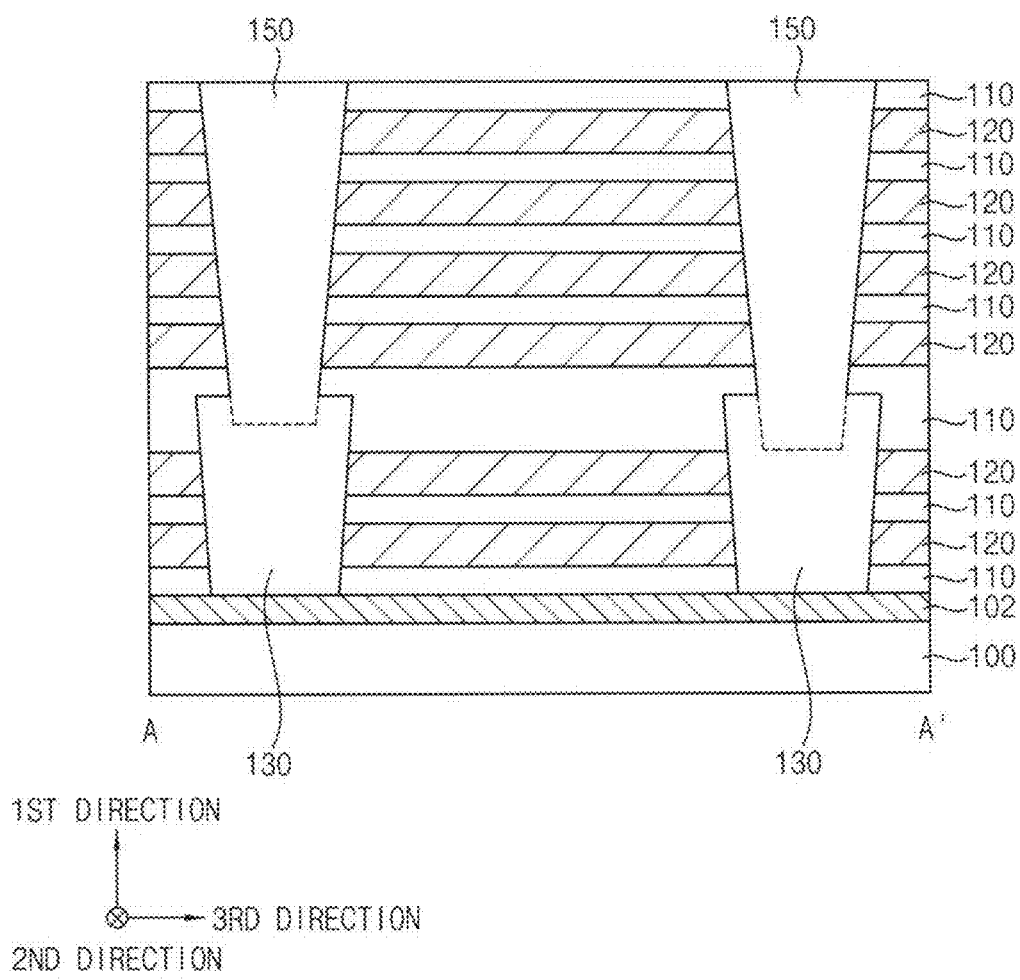
FIGS. 22 to 25 are cross-sectional views illustrating a method of manufacturing a vertical memory device according to some example embodiments.

Referring to FIG. 22, processes substantially the same as or similar to those described with reference to FIGS. 4 to 9 may be performed.

However, the insulation layers 110 and the first sacrificial layers 120 may be formed on the second sacrificial layers 130 only at some of levels among the total levels at which the insulation layers 110 and the first sacrificial layers 120 have to be formed, and fourth sacrificial layers 150 may be formed in the first upper holes 140 extending through the insulation layers 110 and the first sacrificial layers 120 to expose upper surfaces of the second sacrificial layers 130.

The fourth sacrificial layers 150 may include, e.g., polysilicon, and thus may be merged with the underlying second sacrificial layers 130.

Figure 23:
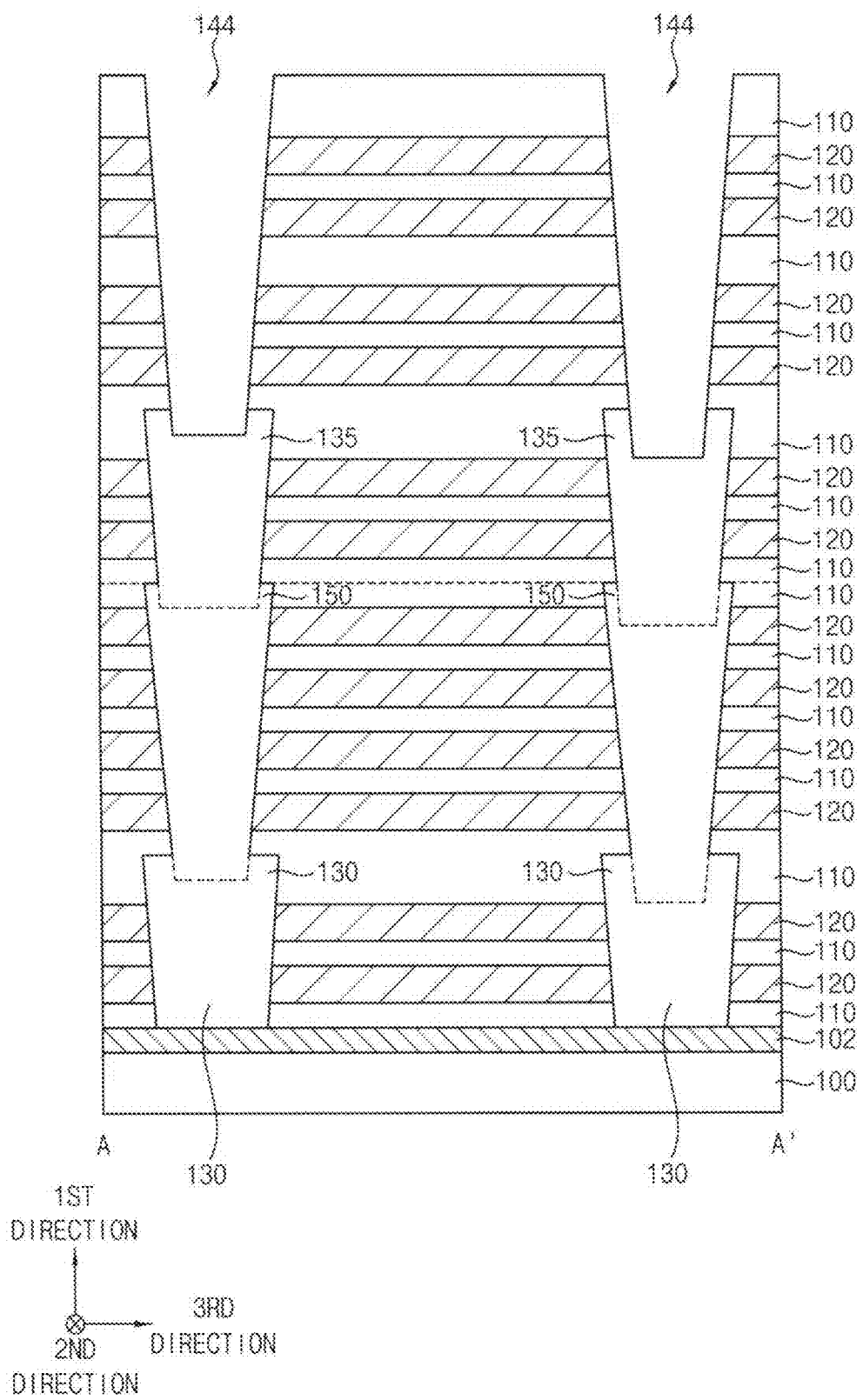

Referring to FIG. 23, processes substantially the same as or similar to those described with reference to FIGS. 4 to 9 may be performed again.

That is, the insulation layers 110 and the first sacrificial layers 120 may be formed on the fourth sacrificial layers 150 at several levels, for example, three and two levels, respectively, and fifth sacrificial layers 135 may be formed through the insulation layers 110 and the first sacrificial layers 120 to contact upper surfaces of the fourth sacrificial layers 150, respectively. The insulation layers 110 and the first sacrificial layers 120 may be formed on the fifth sacrificial layers 135 at other levels, and second upper holes 144 may be formed through the insulation layers 110 and the first sacrificial layers 120 to expose upper surfaces of the fifth sacrificial layers 135, respectively.

In some example embodiments, each of the fifth sacrificial layers 135 may have a size and a shape substantially the same as or similar to those of each of the second sacrificial layers 130, and a width of a top of each of the second upper holes 144 and a width of a bottom of each of the second upper holes 144 corresponding to the upper surface of each of the fifth sacrificial layers 135 may be substantially the same as or similar to the width of the upper surface of each of the fourth sacrificial layers 150 and the width of the bottom of each of the fourth sacrificial layers 150 corresponding to the upper surface of each of the second sacrificial layers 130. Thus, each of the second upper holes 144 may be formed to easily expose the upper surface of each of the fifth sacrificial layers 135.

Figure 24:
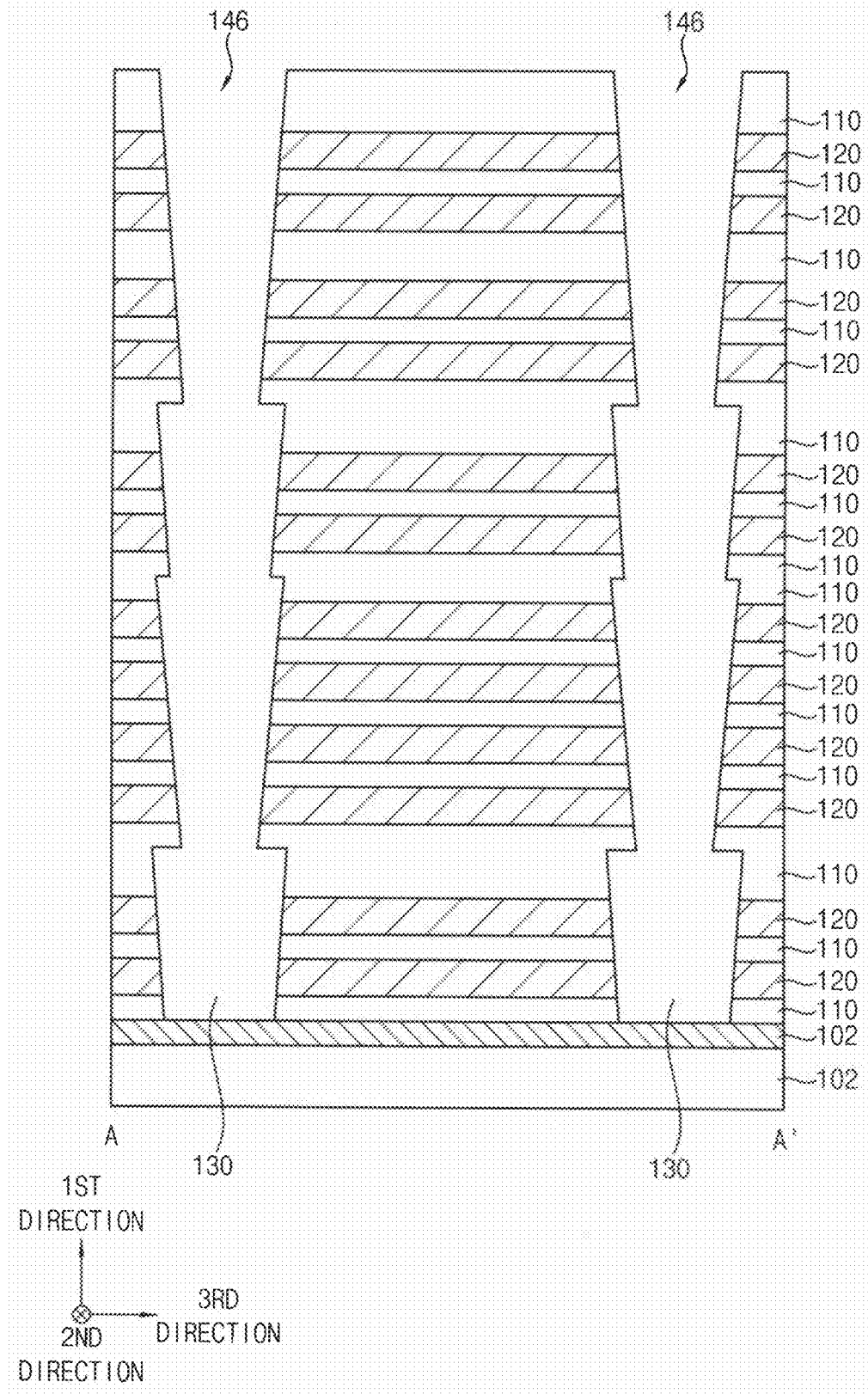

Referring to FIG. 24, the fifth sacrificial layers 135 exposed by the second upper holes 144 and the second and fourth sacrificial layers 130 and 150 thereunder may be removed so that a second channel hole 146 exposing the first impurity region 102 at the upper portion of the substrate 100 may be formed.

Figure 25:
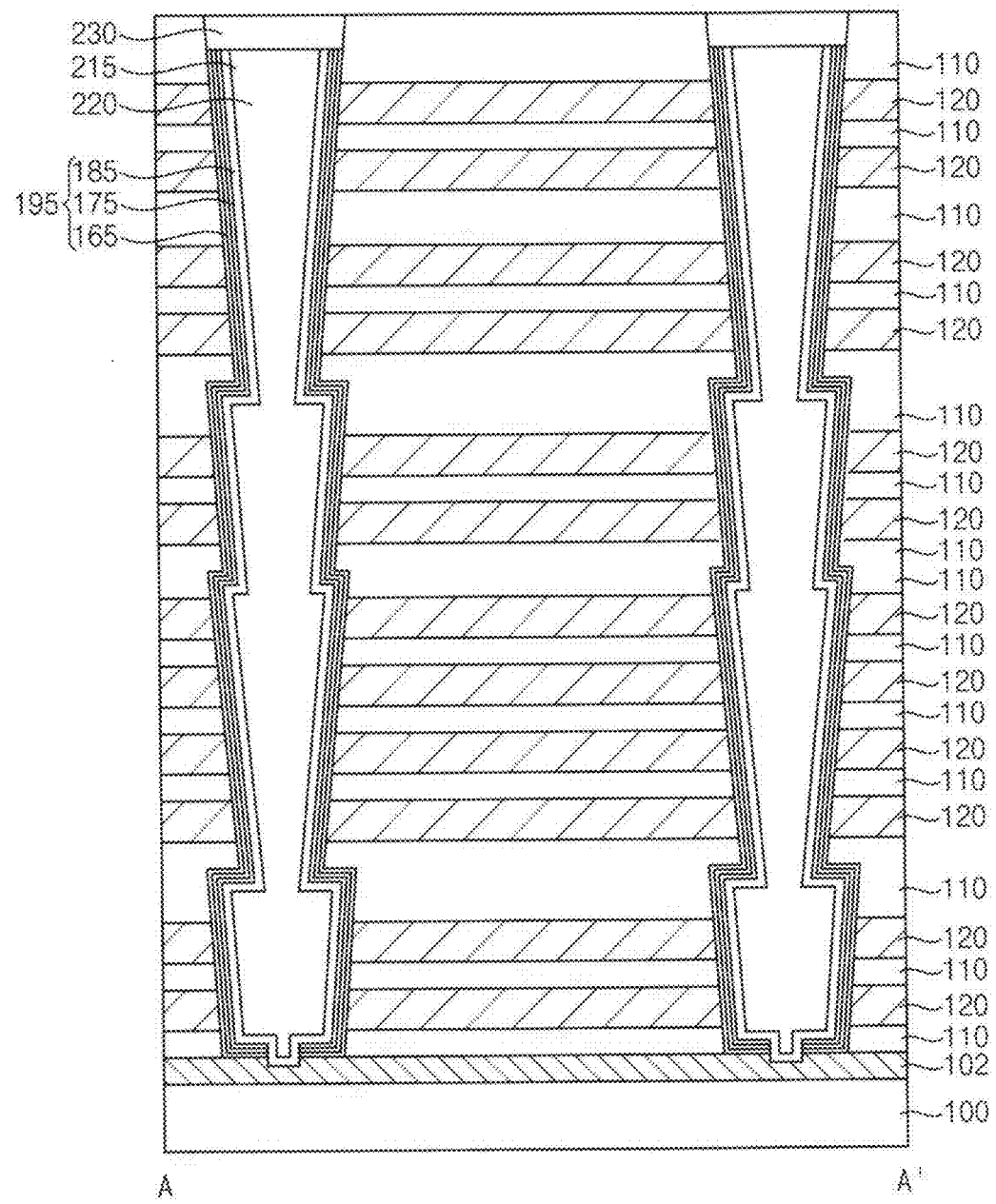

Referring to FIG. 25, processes substantially the same as or similar to those described with reference to FIGS. 10 to 12 may be performed.

Referring to FIG. 21 again, processes substantially the same as or similar to those described with reference to FIGS. 13 to 19 and FIGS. 1 to 3 may be performed to complete the fabrication of the vertical memory device.

As illustrated above, after forming the second sacrificial layers 130, instead of forming the insulation layer 110 and the first sacrificial layer 120 at a desired number of levels and forming the upper channel holes therethrough, only some of the insulation layers 110 and the first sacrificial layers 120 may be formed at lower levels, and the upper channel holes may be formed therethrough. Thus, the bending phenomenon of the upper channel holes that may occur due to the formation through a large number of levels may be alleviated. Additionally, the process for forming the insulation layers 110 and the first sacrificial layers 120 and forming the upper channel holes may be divided into plural numbers, and thus the misalignment or location shift generated during the processes may be corrected between the divided processes.

Inventive concepts are not limited to the number of processes described with reference to FIGS. 22 to 24, and when the number of stacked insulation layers 110 and the first sacrificial layers 120 is large, the formation of the sacrificial layers and the upper channel holes may be divided into more numbers.

Figure 26:
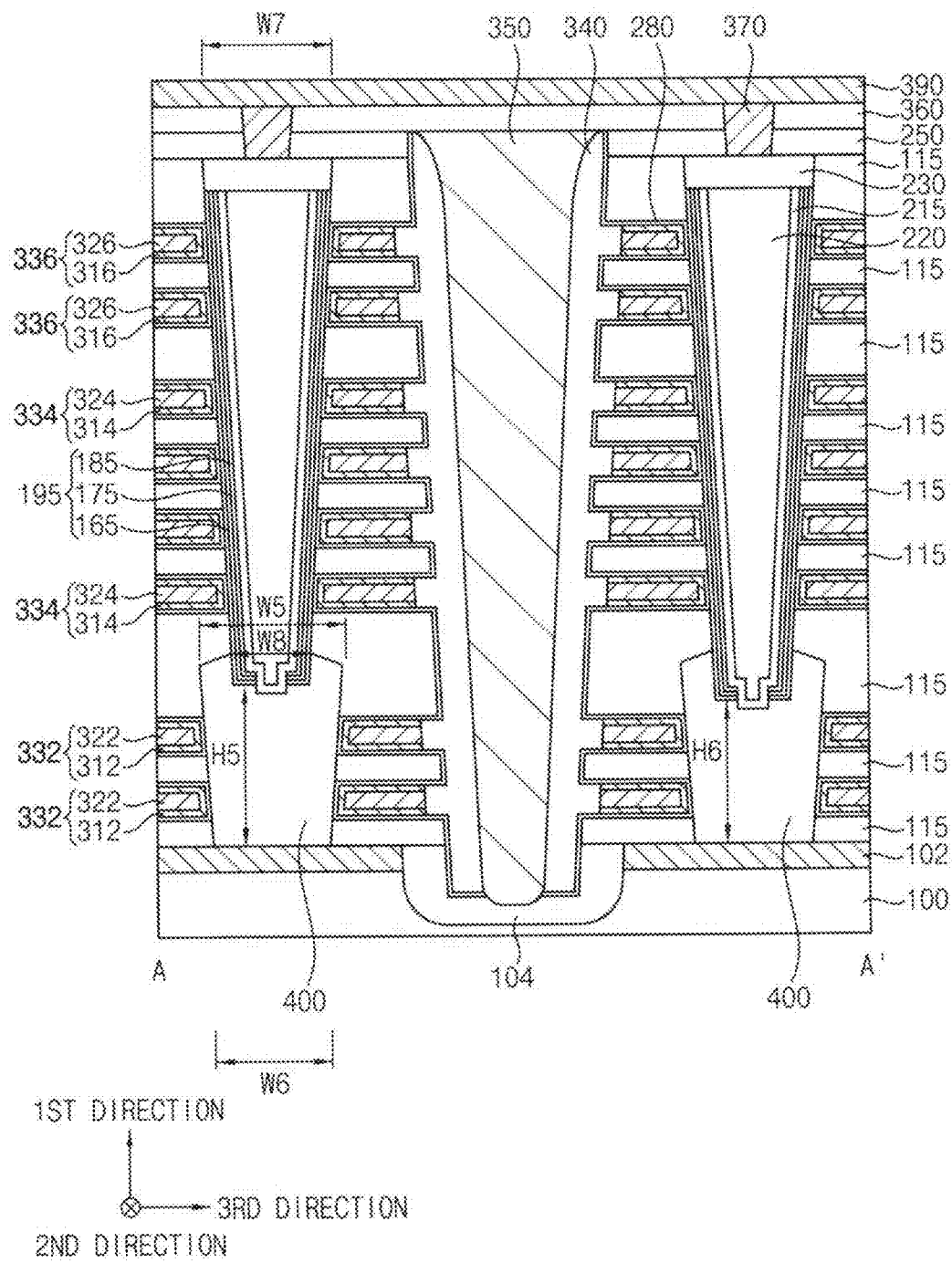
FIG. 26 is a cross-sectional view illustrating a vertical memory device according to some example embodiments.

FIG. 26 is a cross-sectional view illustrating a vertical memory device according to some example embodiments. FIG. 26 is a cross-sectional view taken along a line A-A' of FIG. 1.

This vertical memory device may be substantially the same as that of FIGS. 1 to 3, except for the shape of the second structure. Thus, like reference numerals refer to like elements, and detailed descriptions thereon are omitted herein.

Referring to FIG. 26, the vertical memory device may further include a semiconductor pattern 400 on the first impurity region 102 at the upper portion of the substrate 100, and the second structure including the first structure having the channel 215, the charge storage structure 195 and the filling pattern 220 and the pad 230 may be formed on the semiconductor pattern 400.

The semiconductor pattern 400 may serve as a channel of the first gate electrode 332, and thus the semiconductor pattern 400 and the channel 215 may be referred to as lower and upper channels, respectively.

A fifth width W5 of an upper surface of the semiconductor pattern 400, which may be a maximum width of the semiconductor pattern 400, may be greater than a seventh width W7 of an upper surface of the second structure. Additionally, an eighth width W8 of a bottom of the second structure corresponding to the upper surface of the semiconductor pattern 400 may be less than the fifth width W5 of the upper surface of the semiconductor pattern 400. A sixth width W6 of a lower surface of the semiconductor pattern 400 may be less than the fifth width W5 of the upper surface of the semiconductor pattern 400.

The lower surfaces of the second structures may have a height distribution, however, may be positioned between lower and upper surfaces of one of the insulation patterns 115 corresponding to the upper surfaces of the semiconductor patterns 400. Thus, the characteristics of transistors may not be deteriorated due to the height distribution. In FIG. 26, the second structures include lower surfaces having fifth and sixth heights H5 and H6, respectively.

Figure 27:
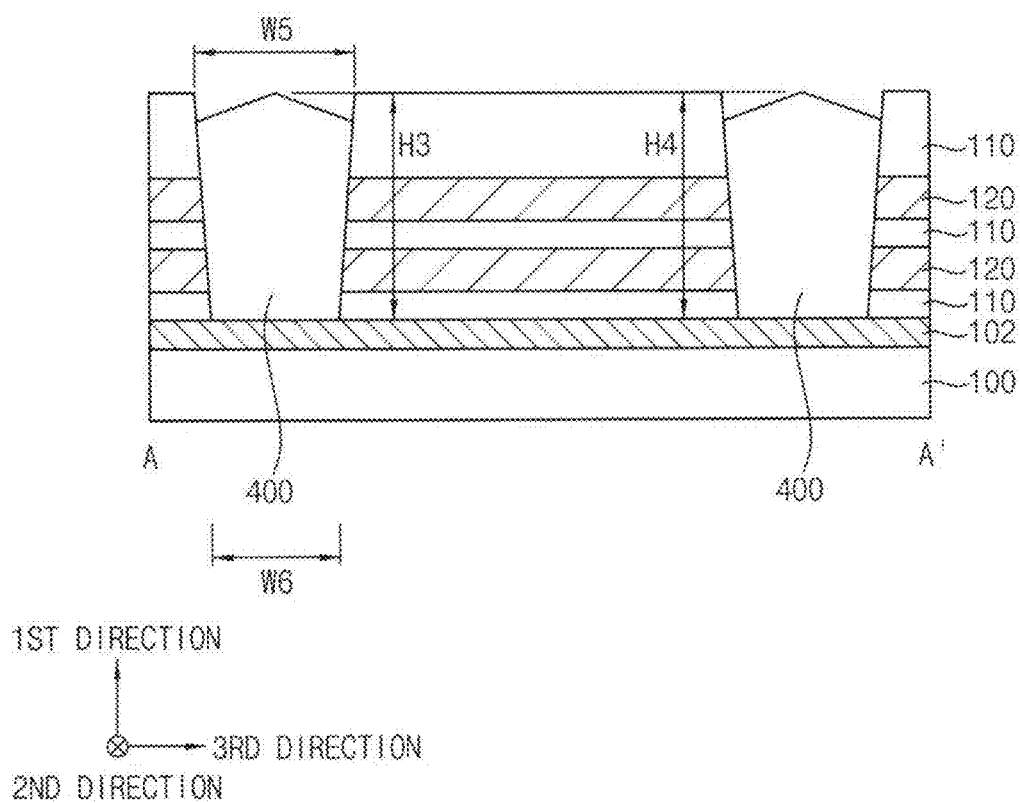
FIGS. 27 to 28 are cross-sectional views illustrating a method of manufacturing a vertical memory device according to some example embodiments.
Figure 28:
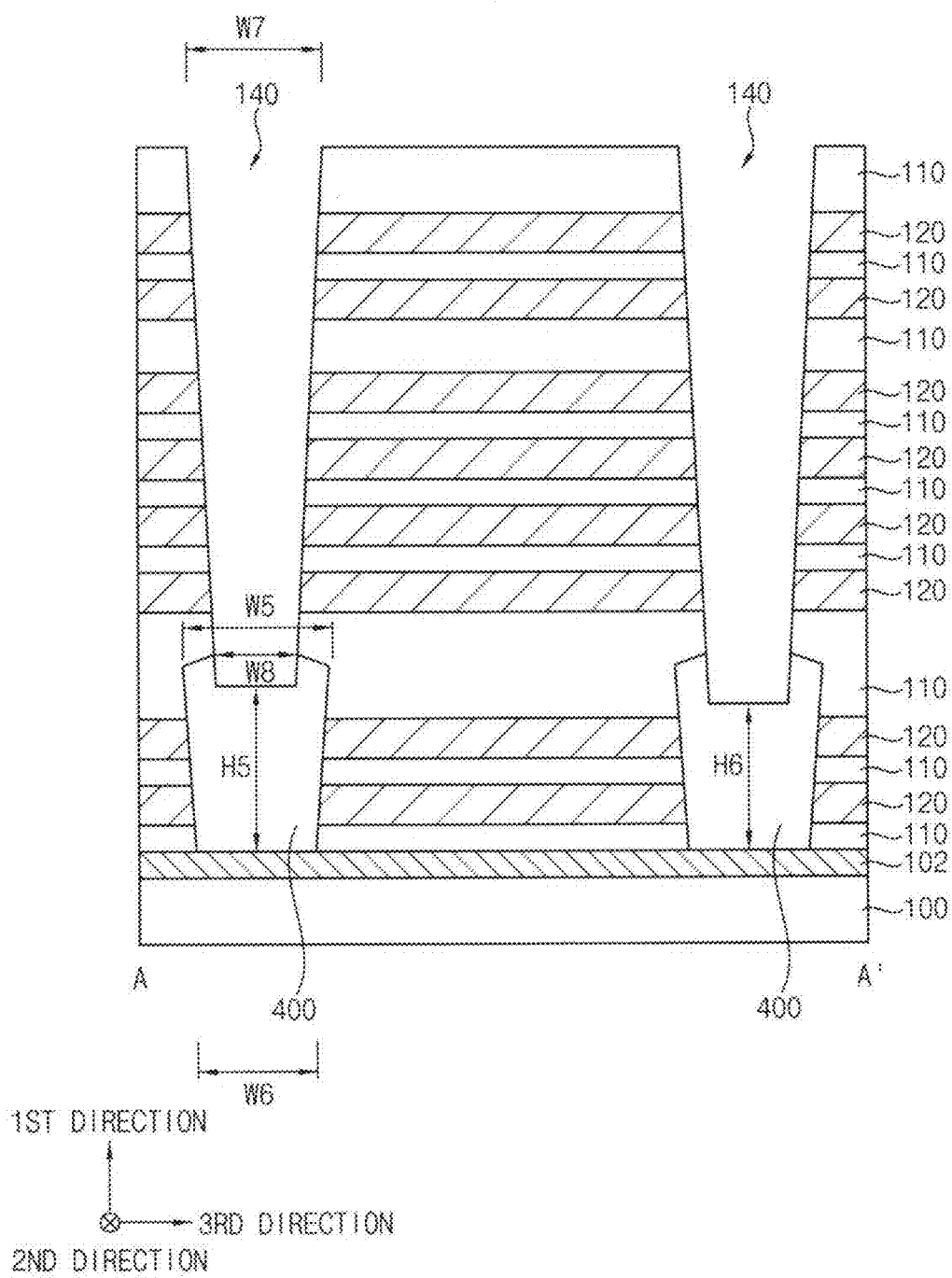

FIGS. 27 to 28 are cross-sectional views illustrating a method of manufacturing a vertical memory device according to some example embodiments. This method may include processes substantially the same as or similar to those described with reference to FIGS. 4 to 19, and thus detailed descriptions thereon are omitted herein.

Referring to FIG. 27, processes substantially the same as or similar to those described with reference to FIGS. 4 to 6 may be performed.

However, instead of forming the second sacrificial layer 130 in each of the first lower holes, a semiconductor pattern 400 may be formed therein.

A selective epitaxial growth (SEG) process may be performed using the upper surface of the substrate 100 exposed by the first lower hole as a seed to form the semiconductor pattern 400 in each of the first lower holes. Thus, the semiconductor pattern 400 may include single crystalline silicon or single crystalline germanium according to the material of the substrate 100. In some embodiments, n-type or p-type impurities may be implanted into the semiconductor pattern 400.

In some example embodiments, the semiconductor pattern 400 may be formed such that an upper surface of the semiconductor pattern 400 may be positioned between lower and upper surfaces of an uppermost one of the insulation layers 110. The upper surfaces of the semiconductor patterns 400 may have a height distribution, however, the height distribution may not be so large.

When the first lower holes are formed by an etching process, the first impurity region 102 may serve as an etch stop layer so that no recess may be formed on the substrate 100 and the first lower holes may have a uniform depth. Additionally, the number of the insulation layers 110 and the first sacrificial layers 120 may not be so high, and thus heights of the upper surfaces of the semiconductor patterns 400 extending through the insulation layers 110 and the first sacrificial layers 120 may be substantially the same as or similar to each other. In the figure, the semiconductor patterns 400 include upper surfaces having third and fourth heights H3 and H4, respectively, which may be substantially the same as each other.

However, the first impurity region 102 may not be formed, and in this case, the height distribution of the upper surfaces of the semiconductor patterns 400 may increase.

Referring to FIG. 28, processes substantially the same as or similar to those described with reference to FIGS. 7 to 9 may be performed.

However, the first upper holes 140 may expose the upper surfaces of the semiconductor patterns 400, respectively.

In some example embodiments, the fifth width W5 of the upper surface of the semiconductor pattern 400, which may be the maximum width of the semiconductor pattern 400, may be greater than a seventh width W7 of a top of the first upper hole 140. Additionally, an eighth width W8 of a bottom of the first upper hole 140 corresponding to the upper surface of the semiconductor pattern 400 may be less than the fifth width W5 of the upper surface of the semiconductor pattern 400. A sixth width W6 of a lower surface of the semiconductor pattern 400 may be less than the fifth width W5 of the upper surface of the semiconductor pattern 400.

The lower surfaces of the first upper holes 140 may have a height distribution, however, may be positioned between lower and upper surfaces of one of the insulation layers 110 corresponding to the upper surfaces of the semiconductor patterns 400. Thus, the characteristics of transistors may not be deteriorated due to the height distribution. In the figure, the first upper holes 140 include lower surfaces having fifth and sixth heights H5 and H6, respectively.

Referring to FIG. 28, processes substantially the same as or similar to those described with reference to FIGS. 10 to 19 and FIGS. 1 to 3 may be performed to complete the fabrication of the semiconductor device.

Figure 29:
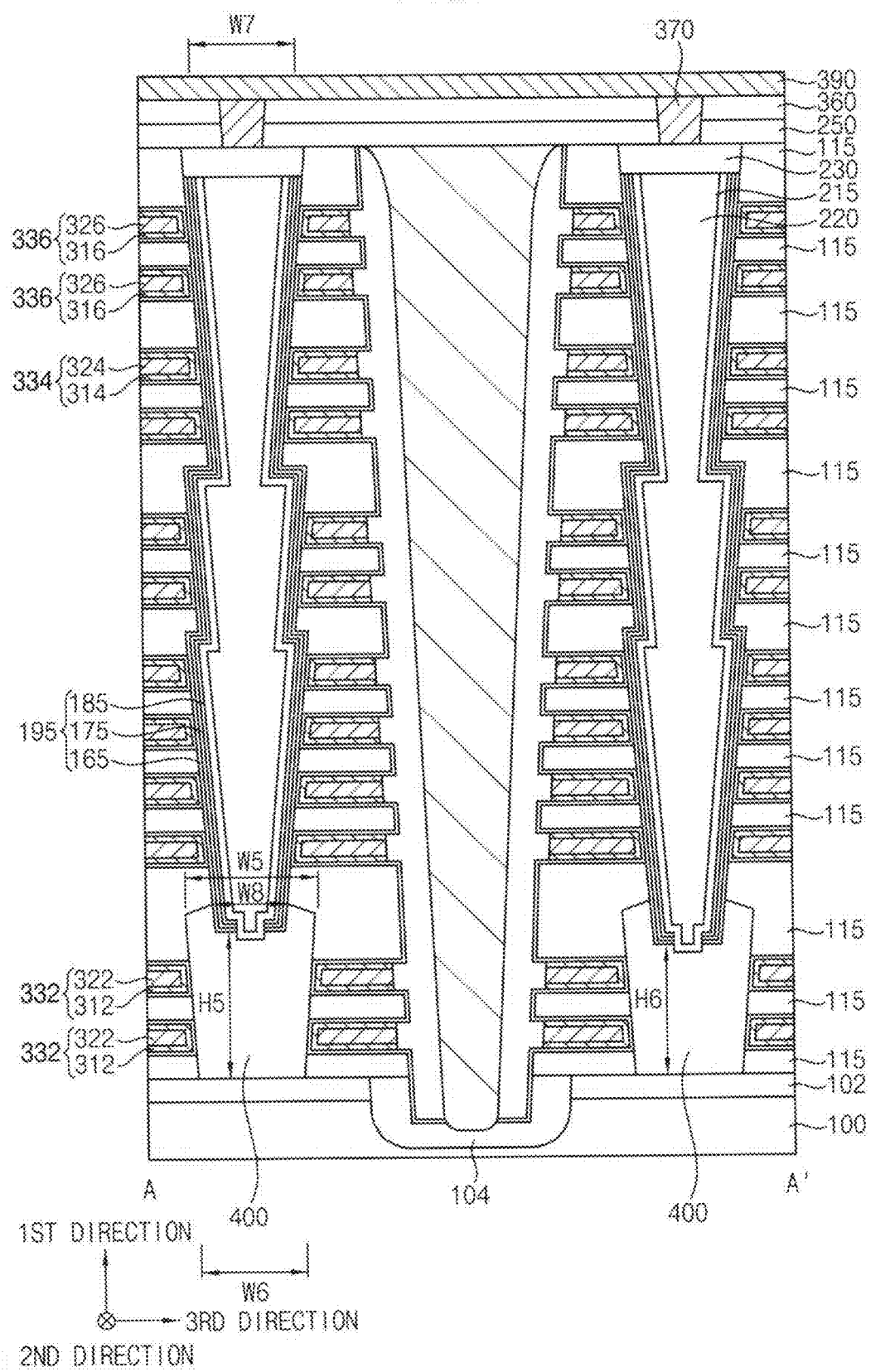
FIG. 29 is a cross-sectional view illustrating a vertical memory device according to some example embodiments.

FIG. 29 is a cross-sectional view illustrating a vertical memory device according to some example embodiments. FIG. 29 is a cross-sectional view taken along a line A-A' of FIG. 1.

This vertical memory device is the application of at least some of the concepts of the vertical memory device of FIG. 21 into the vertical memory device of FIG. 26.

Referring to FIG. 29, the vertical memory device may include the second structure on the semiconductor pattern 400, and the second structure may include the second, third and fourth portions sequentially stacked in the first direction.

That is, the first portion of the second structure of FIG. 21 may be replaced with the semiconductor pattern 400.

While some example embodiments have been particularly shown and described, it will be understood by one of ordinary skill in the art that variations in form and detail may be made therein without departing from the spirit and scope of the claims.

What is claimed is:
1. A vertical memory device, comprising:
 a substrate, an upper portion of the substrate including an impurity region doped with impurities;
 a gate electrode structure on the substrate, the gate electrode structure including gate electrodes spaced apart from each other in a vertical direction substantially perpendicular to an upper surface of the substrate, the gate electrode structure including at least one first gate electrode serving as a selection line, and a plurality of second gate electrodes serving as word lines, respectively, over the at least one first gate electrode; and
 a channel extending through the gate electrode structure in the vertical direction to contact the impurity region of the substrate, the channel including a first portion and a second portion sequentially stacked,
  the first portion having a slanted sidewall with respect to the upper surface of the substrate, a width of an upper surface of the first portion being greater than a width of a lower surface thereof, and a width of an upper surface of the second portion being less than the width of the upper surface of the first portion, wherein the upper surface of the first portion of the channel is higher than an upper surface of the at least one first gate electrode, and wherein a lower surface of a lowermost one of the plurality of second gate electrodes is higher than the upper surface of the first portion of the channel.

2. The vertical memory device of claim 1, wherein the at least one first gate electrode serves as a GSL, and wherein the gate electrode structure further includes at least one third gate electrode serving as an SSL over the plurality of second gate electrodes.

3. The vertical memory device of claim 1, wherein the at least one first gate electrode includes two first gate electrodes disposed at two levels, respectively, from the upper surface of the substrate, each of the two first gate electrodes overlapping the first portion of the channel in a horizontal direction substantially parallel to the upper surface of the substrate, and wherein the upper surface of the first portion of the channel is higher than an upper surface of an upper one of the two first gate electrodes at an upper level of the two levels.

4. The vertical memory device of claim 3, further comprising a charge storage structure covering an outer sidewall of the channel on the substrate, the charge storage structure including a tunnel barrier pattern, a charge storage pattern, and a blocking pattern sequentially stacked from the outer sidewall of the channel.

5. The vertical memory device of claim 4, further comprising:
a filling pattern; and
a pad on the filling pattern, the channel, and the charge storage structure,
wherein the channel has a hollow cylindrical shape, and
wherein the filling pattern fills an inner space defined by an inner sidewall of the channel.

6. The vertical memory device of claim 5, wherein a maximum width of the charge storage structure corresponding to the upper surface of the upper one of the two first gate electrodes is equal to or less than a width of an upper surface of the pad.

7. The vertical memory device of claim 4, wherein the charge storage structure further covers the lower surface of the first portion of the channel, and
wherein a central lower portion of the first portion of the channel extends through the charge storage structure to contact the impurity region.

8. The vertical memory device of claim 1, wherein the second portion of the channel has a slanted sidewall with respect to the upper surface of the substrate, the width of the upper surface of the second portion being greater than a width of a lower surface thereof.

9. The vertical memory device of claim 1, wherein the channel further includes a third portion and a fourth portion sequentially stacked on the second portion thereof, each of the third and fourth portions having a slanted sidewall with respect to the upper surface of the substrate, and
wherein a width of an upper surface of the third portion is greater than a width of the lower surface thereof, and a width of an upper surface of the fourth portion is greater than a width of a lower surface thereof.

10. The vertical memory device of claim 9, wherein the width of the upper surface of the fourth portion is less than the width of the upper surface of the third portion.

11. The vertical memory device of claim 1, wherein the impurity region includes carbon or p-type impurities.

12. A vertical memory device, comprising:
a substrate including an impurity region doped with impurities;
a channel structure on the substrate,
the channel structure including a lower channel on an upper surface of the impurity region of the substrate and an upper channel contacting an upper surface of the lower channel, the lower channel having a slanted sidewall with respect to an upper surface of the substrate such that a width of the upper surface of the lower channel is greater than a width of a lower surface thereof, and the lower channel having a pillar shape,
the upper channel having a slanted sidewall with respect to the upper surface of the substrate, and having a hollow cylindrical shape;
a charge storage structure covering an outer sidewall of the upper channel of the channel structure, a width of an upper surface of the charge storage structure being less than a maximum width of the lower channel of the channel structure; and
a gate electrode structure on the substrate, the gate electrode structure including gate electrodes spaced apart from each other in a vertical direction substantially perpendicular to the upper surface of the substrate, each of the gate electrodes covering an outer sidewall of the channel structure or the charge storage structure, and the gate electrode structure including at least one first gate electrode serving as a selection line, and a plurality of second gate electrodes serving as word lines, respectively, over the at least one first gate electrode,
wherein the upper surface of the lower channel of the channel structure is higher than an upper surface of the at least one first gate electrode, and
wherein a lower surface of a lowermost one of the plurality of second gate electrodes is higher than the upper surface of the lower channel of the channel structure.

13. The vertical memory device of claim 12, further comprising a plurality of channel structures on the substrate, wherein the plurality of channel structures include the channel structure, and
wherein the upper channels of at least two of the plurality of channel structures have lower surfaces at different heights from each other.

14. The vertical memory device of claim 13, wherein upper surfaces of the lower channels included in the plurality of channel structures are substantially coplanar with each other.

15. The vertical memory device of claim 12, further comprising:
a filling pattern filling a space defined by an inner sidewall of the upper channel of the channel structure; and
a pad on the filling pattern, the upper channel, and the charge storage structure.

16. The vertical memory device of claim 15, wherein the at least one first gate electrode includes two first gate electrodes disposed at two levels, respectively, from the upper surface of the substrate, each of the two first gate electrodes overlapping the lower channel in a horizontal direction substantially parallel to the upper surface of the substrate,
wherein the upper surface of the lower channel of the channel structure is higher than an upper surface of an upper one of the two first gate electrodes at an upper level of the two levels, and wherein a width of the lower channel of the channel structure corresponding to the upper surface of the upper one of the two first gate electrodes is equal to or less than a width of an upper surface of the pad.

17. The vertical memory device of claim 12, wherein the at least one first gate electrode serves as a GSL, and wherein the gate electrode structure further includes at least one third gate electrode serving as an SSL over the plurality of second gate electrodes.

18. The vertical memory device of claim 12, wherein a width of an upper surface of the upper channel of the channel structure is greater than a width of a lower surface thereof.

19. A vertical memory device, comprising:

a substrate including an impurity region at an upper portion of the substrate;

a gate electrode structure on the substrate, the gate electrode structure including gate electrodes spaced apart from each other in a vertical direction substantially perpendicular to an upper surface of the substrate, the gate electrode structure including at least one first gate electrode serving as a GSL and a plurality of second gate electrodes serving as word lines, respectively, over the at least one first gate electrode; and a channel on the substrate, the channel extending in the vertical direction on the substrate through the gate electrode structure and an upper portion of the impurity region of the substrate, the channel including a plurality of portions sequentially stacked in the vertical direction and connected with each other, each of the plurality of portions having a slanted sidewall with respect to the upper surface of the substrate such that a width of an upper surface is greater than a width of a lower surface, wherein a width of an upper surface of a first portion among the plurality of portions of the channel disposed at an odd-numbered level from the upper surface of the substrate is greater than a width of an upper surface of a second portion among the plurality of portions of the channel directly above the first portion, wherein an upper surface of a lowermost one of the first portions of the plurality of portions of the channel is higher than an upper surface of the at least one first gate electrode, and wherein a lower surface of a lowermost one of the second gate electrodes is higher than the upper surface of the lowermost one of the first portions of the plurality of portions of the channel.

20. The vertical memory device of claim 19, wherein the gate structure further includes at least one third gate electrode serving as an SSL over the plurality of second gate electrodes.

* * * * *